United States Patent
Glenn et al.

(10) Patent No.: US 7,203,259 B2
(45) Date of Patent: Apr. 10, 2007

(54) PHASE INTERPOLATOR

(75) Inventors: Robert C. Glenn, Bend, OR (US); Michael W. Altmann, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 838 days.

(21) Appl. No.: 10/039,253

(22) Filed: Jan. 2, 2002

(65) Prior Publication Data

US 2003/0123589 A1 Jul. 3, 2003

(51) Int. Cl.
*G01R 29/00* (2006.01)
*H03L 7/00* (2006.01)
*H04L 7/00* (2006.01)

(52) U.S. Cl. .................. 375/354; 375/371; 375/373; 327/2; 327/141

(58) Field of Classification Search ............... 327/258, 327/248; 375/340; 359/189
See application file for complete search history.

(56) References Cited

U.S. PATENT DOCUMENTS

| | | | |
|---|---|---|---|
| 6,285,726 B1* | 9/2001 | Gaudet ...................... 375/376 |
| 6,380,783 B1* | 4/2002 | Chao et al. .................. 327/258 |
| 6,385,126 B2* | 5/2002 | Jung et al. ................... 365/233 |
| 6,484,268 B2* | 11/2002 | Tamura et al. .............. 713/600 |
| 6,509,773 B2* | 1/2003 | Buchwald et al. .......... 327/248 |
| 6,943,606 B2 | 9/2005 | Dunning et al. |
| 6,947,510 B2* | 9/2005 | Dietl et al. ................. 375/354 |
| 2003/0122588 A1 | 7/2003 | Glenn |
| 2003/0123594 A1 | 7/2003 | Glenn et al. |

* cited by examiner

*Primary Examiner*—Khanh Tran
*Assistant Examiner*—Linda Wong
(74) *Attorney, Agent, or Firm*—Blakely, Sokoloff, Taylor & Zafman LLP

(57) ABSTRACT

An arrangement for generating a clock signal. Embodiments provide a method, apparatus, system, and machine-readable medium to interpolate phases of a reference clock signal to output an interpolated clock signal. Some embodiments may output the clock signal as a recovered clock signal for a phase interpolator-based clock recovery system. Many embodiments may interpolate a changing phase of an interpolated clock signal with substantially analog transitions.

29 Claims, 20 Drawing Sheets

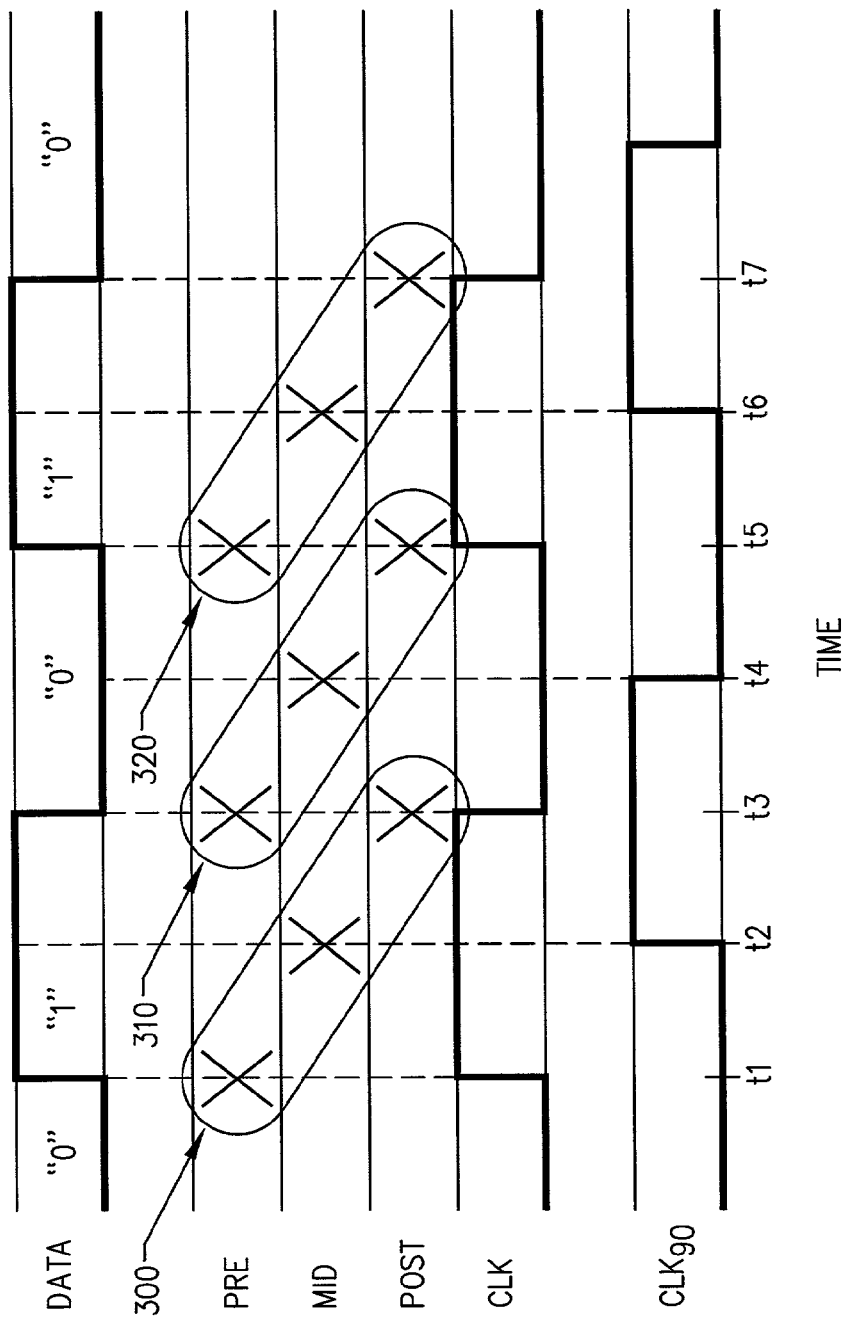

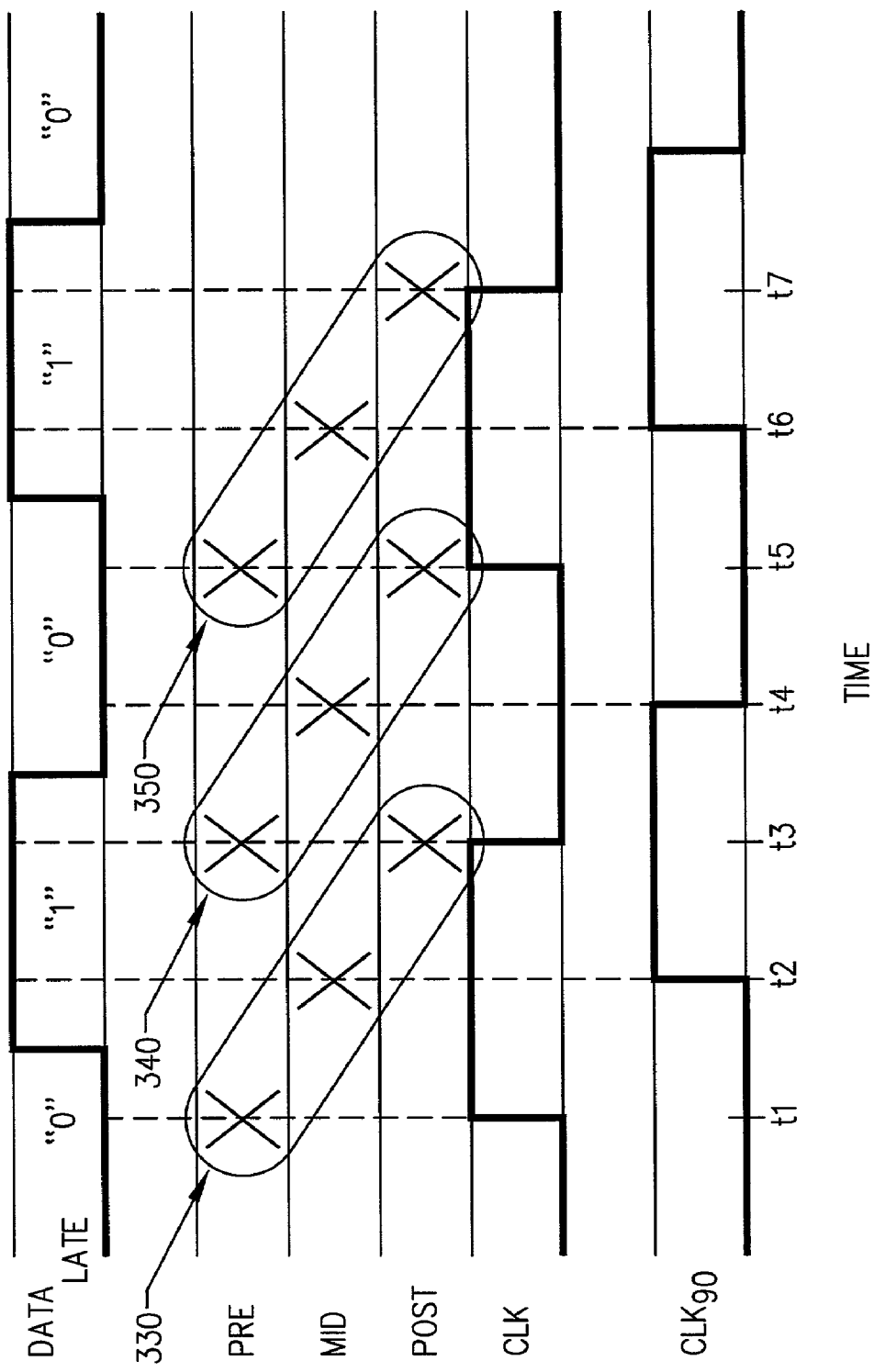

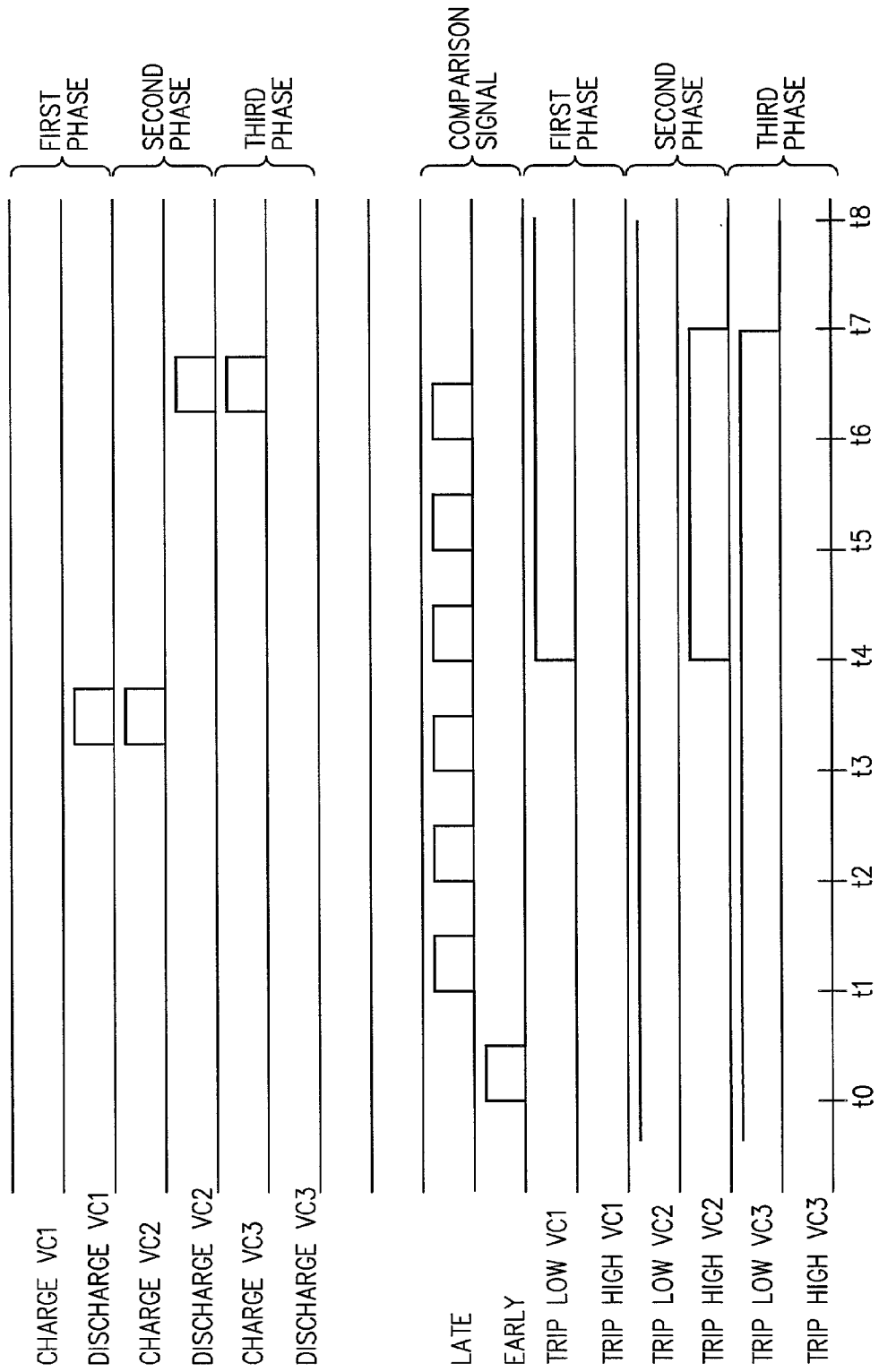

PHASE INTERPOLATOR

FIELD OF INVENTION

The present invention is in the field of generating a clock signal. More particularly, the present invention provides a method, apparatus, system, and machine-readable medium to interpolate phases of a reference clock signal to output an interpolated clock signal.

BACKGROUND

Many networks transmit clocked data without the corresponding clock signal to decrease noise and increase the bandwidth of the interconnection medium, or data transmission medium. Even when transmitting clocked data across a transmission medium without the corresponding clock signals, noise in the data signal, such as transmitter jitter, channel jitter and data dependent jitter, reduces the sampling window for data. For example, transmitter jitter can result from many sources such as feed through, random jitter, systematic offsets and duty cycle distortion. Duty cycle distortion, for instance, is caused by non-symmetric positive and negative duty cycles of a data symbol and can show up either as a high frequency correlated jitter or as a phase step. Further, channel jitter can result from phase dispersion, such as inter-symbol interference (ISI). When a long stream of ones, primarily a sinusoid of 8 MHz and 24 MHz, transitions into a long stream of zeros, primarily a sinusoid of 16 MHz, differences in the propagation delay between 8 MHz, 16 MHz, and 24 MHz of the transmission medium can cause phase shifts at each transition point. The phase shifts, phase steps, and reduced duty cycles reduce the perceivable sampling window by the receiver.

Receivers are designed to compensate for the smaller sampling window by attempting to align the data sampling clock signal, or recovered clock signal, with the center of the data-sampling window. Receivers incorporate a clock generator such as a voltage-controlled oscillator (VCO) with a phase-locked loop (PLL) to follow the phase of the data signal to align data samples with the center of a sampling window. Further, in many applications, the data is re-transmitted at a second clock frequency, usually near the frequency of the data signal. For instance, in synchronous optical networks (SONET), an optical carrier (OC) is received, converted into electrical signals, amplified, and deserialized by serializer-deserializer circuitry. However, using two VCO's on a chip to sample and re-transmit the data of the data signal can result in the noise coupling, typically called injection locking. Injection locking describes noise coupling between two VCO's through their power supplies, ground lines, or substrate, that locks the phases of the two VCO's for a short time when their phases cross.

Serializer-deserializer circuitry is designed to avoid or attenuate the effects of injection locking. Some serializer-deserializer circuitry is provided in two separate chips, a receiver chip with a data sampling VCO and a transmitter chip with a transmission VCO. The receive and transmit chips are matched to optimize performance but take more physical space in a layout and increase production and distribution costs for the serializer-deserializer circuitry. Other serializer-deserializer circuitry attempts to avoid the effects of injection locking while maintaining the receiver circuitry and transmitter circuitry on the same chip by incorporating a VCO that outputs more than one phase of a clock signal and selecting the receive and re-transmit clock signals from the VCO or from a discrete number of interpolated phase steps between the phases of the VCO. The discrete steps result from digital control of changes made to the phase of the interpolated clock signal, referred to as a recovered clock signal in these applications. The discrete phase steps present a problem, however, since the steps feasibly obtained from a VCO are large with respect to the phase shifts resulting from noise, especially with respect to data signals in the gigahertz range, and result in significant differential non-linearities in the interpolated clock signal when transitioning between phases.

BRIEF DESCRIPTION OF THE DRAWINGS

In the accompanying drawings, like references may indicate similar elements:

FIG. 3a–3c depicts an embodiment of timing diagrams for sampling data of a data signal and generating a comparison signal in response to the sampling.

FIG. 4 depicts an embodiment of a timing diagram for an embodiment of logic to generate charge and discharge signals for a voltage controller in response to high speed early and late signals from a sampling circuit.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments. The variations of embodiments anticipated for the present invention are too numerous to discuss individually so the detailed descriptions below are designed to make such embodiments obvious to a person of ordinary skill in the art.

Figure 1:
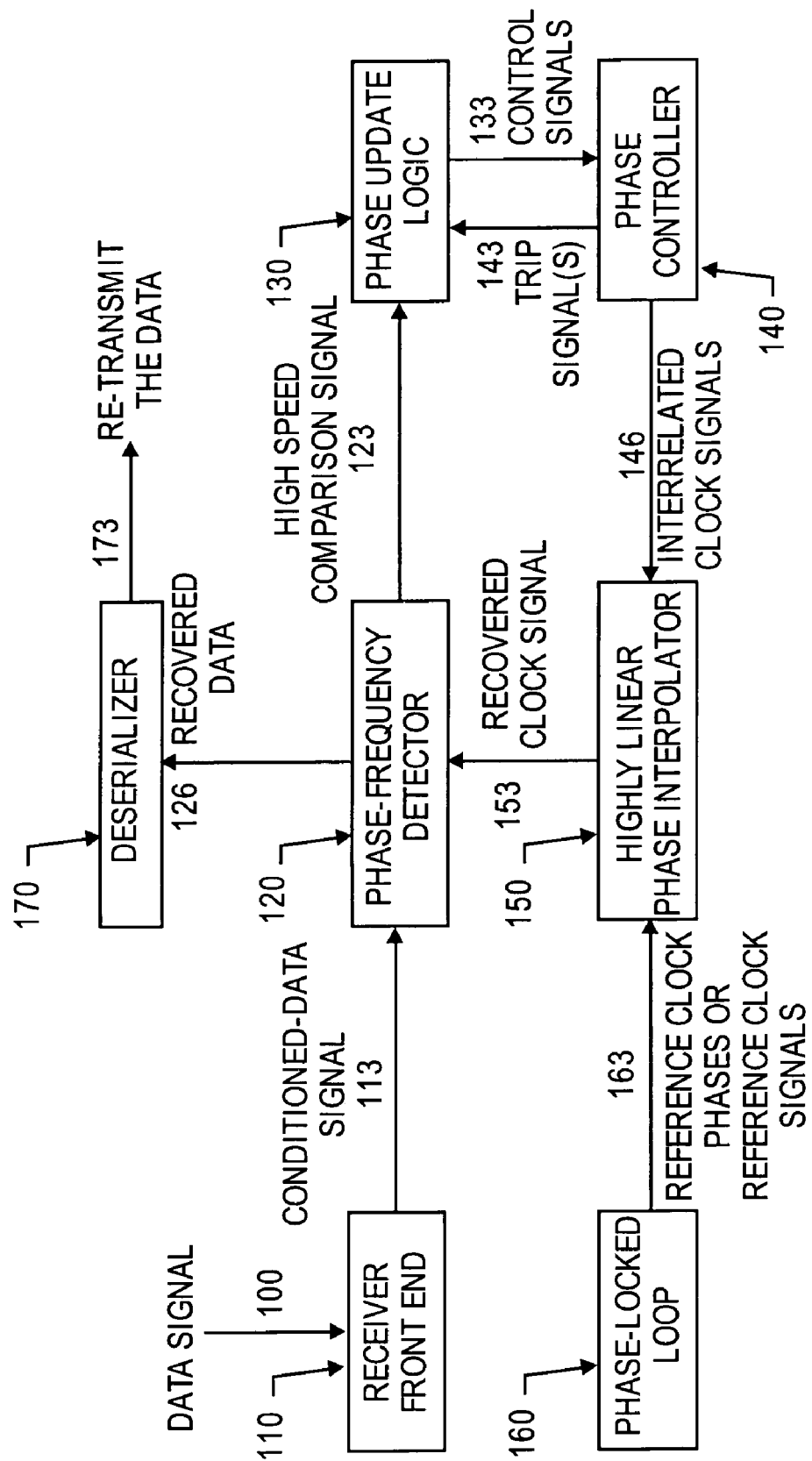
FIG. 1 depicts an embodiment of a phase interpolator based clock recovery system to re-clock and re-transmit the recovered data.

Referring now to FIG. 1, there is shown an embodiment of a phase interpolator based clock recovery system to re-clock and re-transmit the recovered data. For example, a data signal 100 may comprise data clocked at a frequency of 1.0625 Ghz for transmission across a fiber optic cable and the present embodiment may re-transmit the data at a clock frequency 1.25 Ghz across an Ethernet network. The embodiment may comprise a receiver front end 110, phase-frequency detector 120, phase update logic 130, phase controller 140, highly linear phase interpolator 150, phase-locked loop 160, and deserializer 170. The receiver front end 110 may receive a synchronous transport signal (STS) of an optical carrier (OC) used to carry data across a transmission medium, such as an optical fiber of a fiber optic transmission medium via a photo-diode and a transimpedence amplifier. The receiver front end 110 may comprise a low noise amplifier to amplify the signal to an amplitude appropriate for the phase-frequency detector 120, producing a conditioned data signal 113.

The phase-frequency detector 120 may receive the conditioned signal 113 from the receiver front end 110 and sample data from the data signal with a recovered clock signal 153, or interpolated clock signal, from the highly linear phase interpolator 150. In some embodiments, the sampling circuitry of the phase-frequency detector comprises a clocked flip-flop to perform a comparison between the recovered clock signal 153 and the conditioned data signal 113, and generate an early/late, high-speed comparison signal 123 from the comparison. The high-speed comparison signal 123 may be part of a feedback loop to increase the accuracy for sampling data of the conditioned data signal 113. One embodiment comprises a phase-frequency detector 120 with frequency tracker circuitry to cause the recovered clock signal to track low frequency jitter and frequency offsets in the conditioned data signal 113, so the system may react as a second order system. In many of these embodiments, the frequency tracker circuitry may determine an update pattern based upon past phase updates and implement the update pattern in response to an absence of phase updates or phase update information. In an alternate embodiment a smoothing filter may be added to minimize phase update dithering due to "alternating" update information.

In some embodiments, the sampling clock signal may be a multiple of the frequency of an anticipated clock frequency for the conditioned data signal 113. For example, when two samples of data are to be taken by the phase-frequency detector 120, the recovered clock signal 153 from which the sampling clock signal may be based, may be twice the frequency expected of the conditioned data signal 113. In many embodiments, a sampling clock signal may be generated at a frequency substantially equivalent to the anticipated frequency of the conditioned data signals 113 and in several of these embodiments, the phase of the sampling clock signal may lead the data signal by 90 degrees such that a transition in the sampling clock signal occurs at the middle of the data sampling window. Thus, the highly linear phase interpolator 150 may output a recovered clock signal 153 along with a sampling clock signal that leads the recovered clock signal by 90 degrees. In other embodiments, the recovered clock signal 153 may be accompanied with a clock signal having an offset smaller than or greater than ninety degrees. The high-speed comparison signal 123 may indicate whether two or three samples sampled the same data. In these embodiments, the sampling rate may be twice the frequency of the data signal so when three samples are of the same data, the first sample may lie on the rising edge of the data, the second sample may lie in the middle of the data, and the third sample may lie on the falling edge of the data. In a situation where three data samples indicate the same data, the high-speed comparison signal 123 may not indicate that a change may be made to the sampling clock. On the other hand, in a situation where only two samples indicate the same data, the phase of the sampling clock may lead or lag the phase of the conditioned data signal 113, depending upon whether the first sample or the third sample is different.

The phase-frequency detector 120 may further comprise an output of the data sampled, typically called recovered data 126. In one embodiment, the phase-frequency detector 120 may output the recovered clock signal 153 along with the recovered data 126.

The deserializer 170 may receive the recovered data 126 and re-transmit the data 173 in accordance with a different protocol. For instance, the deserializer 170 may transmit 8 bits of data in parallel rather than transmitting the data in series. In some of these embodiments, the deserializer 170 may re-clock the data with a transmission clock based off an output of the phase-locked loop 160 and re-transmit the data 173. The deserializer 170 may comprise a first-in, first-out (FIFO) data queue to compensate for frequency offset and a circuitry to deal with the disparity of the data rate.

The phase update logic 130 may receive the high-speed comparison signal 123 from the phase-frequency detector 120 to generate a control signal(s) 133 for the phase controller 140. In the present embodiment, the phase update logic 130 may also receive a trip signal(s) 143 from the phase controller 140 to indicate a change in the phase of the recovered clock signal 153 to a phase between a different set of reference clock phases. For example, when phase controller 140 is a voltage controller, phase update logic 130 may generate a control signal 133 comprising a charge signal and a discharge signal to cause the phase controller to increase the voltage of one interrelated control signal 146 while decreasing the voltage of a second interrelated control signal 146, wherein the first interrelated control signal and the second interrelated control signal may manage the amplitude contributions of reference clock phases 163 to the recovered clock signal. In many embodiments, the phase controller 140 may change the phase and frequency of the recovered clock signal, up or down, in response to charge and discharge signals, as well as stop the interpolated clock signal at a particular phase, or attempt to stop the interpolated clock signal, at a frequency and phase within loop parameters of the clock recovery system.

The phase update logic 130 may also filter the high speed comparison signal 123 to reduce the frequency of changes to a frequency that phase controller 140 may accommodate. For example, control signal 133 from phase update logic 130 may instruct a charge and discharge circuit in phase controller 140 to increase the charge stored in one capacitor and decrease the charge stored in a second capacitor, but the rate of charge or the rate of discharge of a capacitor in the phase controller 140 may be slower than changes in the high speed comparison signal 123.

Phase controller 140 may comprise phase control circuitry to generate a control signal for each phase of a reference clock signal, or reference clock phase 163, interpolated by the highly linear phase interpolator 150. The phase controller 140 may modify interrelated control signals 146 to cause the highly linear phase interpolator 150 to change the phase of the recovered clock signal 153. For example, when phase controller 140 is a voltage controller and highly linear phase interpolator 150 interpolates a recovered clock signal 153 from four phases of a reference clock signal, zero degrees, 90 degrees, 180 degrees and 270 degrees, phase controller 140 may output interrelated control signals 146 for zero degrees and 90 degrees to manage a recovered clock signal 153 transitioning from zero degrees to 90 degrees in accordance with the control signal 133. The phase controller 140 may also maintain the interrelated control signals 146 associated with reference clock signals of 180 degrees and 270 degrees substantially at a low amplitude to minimize the amplitude contributions of the 180 degree and 270 degree reference clock phases 163. More particularly, when the recovered clock signal is in the quadrant between zero and 90 degrees and phase update logic 130 determines that the phase of the recovered clock signal is earlier or less than the phase of the data signal 100, the phase controller 140 may increase the amplitude of the interrelated control signal 146 associated with the 90 degree reference clock signal and decrease the amplitude of the interrelated control signal 146 associated with the zero degree reference clock signal to cause the highly linear phase interpolator 150 to increase the phase of the recovered clock signal 153 with a substantially linear, or analog, transition. In many embodiments, the phase controller may cause the phase interpolator to track sinusoidal jitter as well, which may cause the output phase of the phase interpolator to move periodically back and forth around a particular phase position.

Several embodiments comprise a phase controller 140 designed to bound the voltages or amplitudes of the interrelated control signals 146 to amplitudes within a substantially linear region of a transfer characteristic for the highly linear phase interpolator 150. For example, the highly linear phase interpolator 150 may be able to interpolate between two reference clock signals such as zero degrees and 90 degrees, with substantially analog transitions in the phase of the recovered clock signal when the interrelated control signals 146 remain within a specific amplitude range such as 700 millivolts to 1.2 volts. After the amplitude of an interrelated control signal 146 steps outside the amplitude range, interpolation between two reference clock phases 163 may fall within a non-linear region of a transfer function for the highly linear phase interpolator 150. Interpolating within the non-linear region may cause non-linearities in the recovered clock signals 153 phase transfer function, increasing the differential non-linearity (DNL) of the recovered clock signals 153 phase transfer function.

Other embodiments comprise a phase controller 140 designed to output current signals as interrelated control signals 146. Although, the amplitude boundaries for each of the interrelated control signals 146 may be substantially equivalent in many embodiments.

Further embodiments comprise a phase controller 140 that may output trip signals 143 to the phase update logic 130 to indicate that the interrelated control signals 146 managing the phase of the recovered clock signal 153 have reached the maximum amplitude boundary and/or minimum amplitude boundary for analog transition of the recovered clock signal 153. For instance, when the recovered clock signal 153 lies between the zero degree reference clock phase 163 and the 90-degree reference clock phase 163, the phase update logic 130 may receive a trip signal 143 after a phase of the recovered clock signal 153 moves to a 90-degree phase or a 360-degree phase. The trip signal 143 may indicate which quadrant of reference clock phases may be generating the recovered clock signal and that the recovered clock signal may be nearing a different quadrant of reference clock phases. In some embodiments, when the recovered clock signal move from the first quadrant of zero degrees to 90 degrees back to a phase between zero degrees and 270 degrees, the frequency of the recovered clock signal 153 may decrease when the change is done statistically. Otherwise, the change may be a phase change. In other words, when 360 degrees of phase may be either added or subtracted by rotating the phase interpolator output through the reference clock phases, and the 360 degree change is performed over time in a statistical manner, then the result may become a frequency offset in the phase interpolator output clock versus the frequency of the input reference clocks (which may be the of the same frequency).

In some embodiments, the phase controller 140 may also comprise common mode circuitry to maintain a common mode amplitude between interrelated control signals 146. For example, when the phase controller 140 outputs four interrelated control signals, two of the interrelated control signals 146 managing the recovered clock signal 153 may be bound to a voltage range such as 700 millivolts to 1.2 volts and the common mode circuitry associated with the two interrelated control signals 146 may maintain a common mode amplitude at substantially 950 millivolts. In many embodiments, a resistive ladder may provide reference voltages to bound the amplitudes of the interrelated control signals 146 and to maintain a common mode voltage. In several embodiments, the interrelated control signals 146 may be single-ended voltages output from charge storage circuitry in phase controller 140, while in other embodiments, the interrelated control signals 146 may be differential voltages output from charge storage circuitry in phase controller 140.

The highly linear phase interpolator 150 may be coupled to a clock generator circuit such as phase-locked loop 160 to receive reference clock signals for interpolation and may interpolate to generate a recovered clock signal 153. For example, the phase-locked loop 160 may output four reference clock signals at 5 Ghz with phases of zero degrees, 90 degrees, 180 degrees, and 270 degrees, respectively. The highly linear phase interpolator 150 may weight the amplitudes of the reference clock phases 163 in accordance with the interrelated control signals 146 from the phase controller 140, combine the weighted reference clock phases 163, and filter the combination to generate a recovered clock signal 153. In some embodiments, the highly linear phase interpolator 150 may also output a second, phase-shifted recovered clock signal, such as a recovered clock signal with a 90-degree phase shift. The highly linear phase interpolator 150 may comprise control current circuitry, interpolator circuitry, and output circuitry. The control circuit circuitry may be coupled to the phase controller 140 to receive the interrelated control signals 146 and weight the reference clock signals 163 in accordance with the interrelated control signals 146. The interpolator circuitry may combine the reference clock signals as weighted by the control current circuitry and the output circuitry may filter the combined reference clock signals to output the recovered clock signal 153.

The control current circuitry may be designed to increase the amplitude contribution of a reference clock phase at substantially the same rate as decreasing the amplitude contribution of a second reference clock signal. For instance, the interpolator circuitry may comprise an amplifier circuit for each reference clock phase and the control current circuitry may adjust the amplification or gain of each amplifier. The bounded interrelated control signals 146 may weight the amplitudes of the reference clock phases 163 such that the amplitude contributions of each reference clock phase may be maintained within a linear region or small signal region of output amplifiers of the highly linear phase interpolator 150. In some embodiments, where the amplitude of the weighted reference clock phase may go outside the linear swing range for an amplifier of the highly linear phase interpolator 150, changes in the phase of the recovered clock signal 153 may comprise non-linearities.

The output circuitry may be designed to filter the combined reference clock phases 163 to condition the recovered clock signal 153 for the phase-frequency detector 120. For example, output circuitry may integrate, differentiate, or otherwise filter, the combined reference clock phases 163 and/or may remove noise from the combined reference clock phases 163 to improve the transfer function phase response, to set, fix, and/or control the phase response in a known manner.

Figure 2:
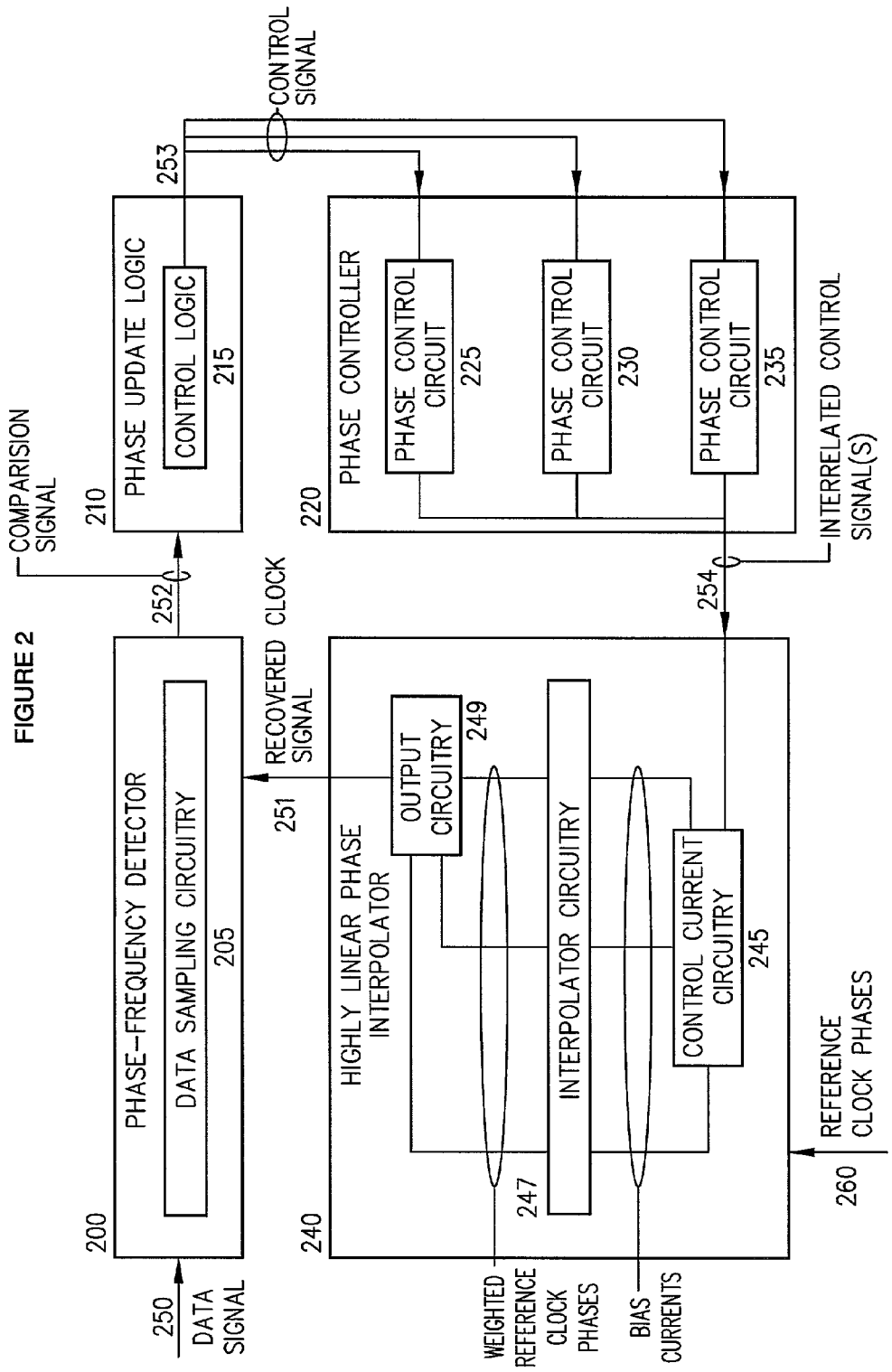
FIG. 2 depicts an embodiment of a phase interpolator based clock recovery circuitry to recover data from a data signal.

Referring now to FIG. 2, there is shown a phase interpolator based clock recovery system. The phase interpolator based clock recovery system may comprise phase-frequency detector 200, phase update logic 210, phase controller 220, and highly linear phase interpolator 240. The phase-frequency detector 200 may receive a data signal 250 comprising clocked data without the corresponding clock signal and sample data from the data signal 250 with a recovered clock signal 251 to determine whether the recovered clock signal 251 leads or lags the phase of the data signal 250. The phase-frequency detector 200 may sample the data signal 250 with data sampling circuitry 205. Data sampling circuitry 205 may sample the data signal 250 at transitions of the sampling clock signal, in this embodiment the recovered clock signal 251 interpolated by the highly linear phase interpolator 240, and compare the results of more than one sample to determine whether the recovered clock signal 251 leads or lags the data signal 250. For example, the recovered clock signal 251 may operate at a frequency approximately twice the frequency that the data signal 250 is clocked at so the data sampling circuitry 205 may take two samples of data approximately 90 degrees apart in phase on the data signal 250. Logic in the phase-frequency detector 205 may associate part of transitions of the recovered clock signal 251 with the middle of the data-sampling window and attempt to maintain those transitions midway between data transitions on the data signal 250. The logic may associate other transitions of the recovered clock signal 251 with a pre/post data sampling time intended to sample the data at or near a data transition. In some embodiments, logic may comprise clocked flip-flops such as a delayed flip-flop to sample data from the data signal 250 with the recovered clock signal 251, or a fraction or multiple thereof, as the input clock.

In some embodiments, the phase-frequency detector 200 may compare a pre-sample, a mid-sample and post-sample of the data signal 250 to determine whether the recovered clock signal 251 leads or lags the data signal 250. For instance, when the recovered clock signal 251 leads the data signal 250, the pre-data sample may comprise a logical zero, the mid-data sample may comprise a logical one, and the post-data sample may comprise a logical one. The post-data sample may also be the pre-data sample for a second data bit or the subsequent data bit. On the other hand, when the recovered clock signal 251 lags the data signal 250, the pre-sample data bit may comprise a logical one, the mid-sample data bit may comprise a logical one, and the post-sample data bit may comprise a logical zero. After the phase-frequency detector 200 determines that samples generated by data sampling circuitry 205 indicate that the recovered clock signal leads or lags the data signal 250, the phase-frequency detector 200 may output a comparison signal 252 indicating that the recovered clock signal 251 leads or lags the data signal 250.

The phase update logic 210 may be coupled to the phase-frequency detector 200 to receive the comparison signal 252 and generate control signals 253 for the phase controller 220. The phase update logic 210 may comprise control logic 215 to generate, for instance, a charge signal and a discharge signal based upon a comparison signal 252, at a frequency compatible with the phase controller 220. The control logic 215 may also receive indications from each phase control circuit 225, 230, and 235, of the phase controller 220, to allow the control logic 215 to track the status and/or progression of the interrelated control signals 254. For instance, the present embodiment of the phase update logic 210 comprises three outputs, one output for each phase control circuit 225, 230, and 235 of phase controller 220 and the control logic 215 may receive an indication from each phase control circuit after an interrelated control signal 254 output from that phase control circuit 225, 230, and 235 reaches an upper or lower amplitude boundary. The control logic 215 may determine after a phase control circuit 225, 230, and 235 reaches an amplitude boundary that the recovered clock signal 251 may be interpolated by a different pair of phases and may modify subsequent control signals 253 accordingly.

In some embodiments, the phase update logic 210 may condition the comparison signal 252 for input into the phase controller 220 and the phase controller 220 may track the phase control circuits 225, 230, and 235 managing the phase of the recovered clock signal 251.

The phase controller 220 may be coupled to the highly linear phase interpolator 240 to provide amplitude-bounded, interrelated control signals 254 so the highly linear phase interpolator 240 may transition the recovered clock signal 251 with analog phase transitions. The phase controller 220 may comprise phase control circuitry 225, 230, and 235 to produce and bound the three interrelated control signals 254. Bounding the three interrelated control signals 254 may weight the amplitude of three reference clock phases 260 such that the amplitudes are maintained within a linear region of the transfer characteristic for the highly linear phase interpolator 240. For example, the phase-frequency detector 200 may output an early comparison signal 252 based upon a comparison of the data signal 250 against the recovered clock signal 251. Phase update logic 210 may receive the early comparison signal 252 to indicate that the recovered clock signal may be early and the phase may be transitioned to compensate, in the form of several high-speed pulses from the phase-frequency detector 200 and control logic 215 may determine that the phase of the recovered clock signal 251 is currently between the reference clock phases 260 associated with phase control circuit 225 and phase control circuit 230. The phase control circuit 225 may be associated with a reference clock phase 260 of zero degrees and the phase control circuit 230 may be associated with a reference clock phase 260 of 120 degrees so control logic 215 may instruct phase control circuit 225 to discharge, instruct phase control circuit 230 to charge, and send no instruction to phase control circuit 235 to indicate that the control signal output from phase control circuit 235 may be maintained. Phase control circuit 225 may be a voltage controller having a charge circuit, a discharge circuit, and charge storage circuitry to manage the amplitude of an interrelated control signal 254 associated with a reference clock phase of zero degrees. The phase control circuit 225 may discharge the charge storage circuitry at a controlled discharge rate. The phase control circuit 230 may be associated with reference clock phase of 120 degrees and comprise a second charge circuit, second discharge circuit, and a second charge storage circuit, similar to phase control circuitry 225. The phase control circuit 230 may charge the second charge storage circuit at substantially the same rate as the discharge rate of the charge storage circuit in phase control circuit 225. In other situations, the phase control circuit 230 may discharge the second charge storage circuit at substantially to the same rate as the charge rate of the charge storage circuit in phase control circuit 225, to change the phase of the recovered clock signal in the opposite direction or to maintain the phase when the phase update logic 210 may dither around a phase.

While the phase of the data signal 250 is between reference clock phase of 120 degrees and a reference clock phase of 240 degrees, the control logic 215 may continue to instruct phase control circuit 225 to discharge until the amplitude associated with the interrelated control signal 254 output from phase control circuit 225 reaches a low amplitude boundary. Phase control circuit 225 may output a low amplitude trip or overflow signal when the amplitude of the interrelated control signal 254 output from phase control circuit 225 is near or reaches the low amplitude boundary. Similarly, the control logic 215 may continue to transmit control signals 253 to phase control circuit 230 to charge until the amplitude of the interrelated control signal 254 output from phase control circuit 230 is near or reaches the high amplitude boundary for the control signal. Phase control circuit 230 may output a high trip or overflow signal to control logic 215 when the amplitude of the interrelated control signal 254 output from phase control circuit 230 is near or reaches the high amplitude boundary.

In the present embodiment, after control logic 215 has received a high overflow signal from phase control circuit 230 and a low overflow signal from phase control circuit 225, control logic 215 may determine that the phase of the data signal 250 may reside between the phases associated with phase control circuit 230 and phase control circuit 235. Control logic 215 may begin to send a discharge signal to phase control circuit 230, a charge signal to phase control circuit 235 and no signal to phase control circuit 225. The control signals 253 to charge and discharge may continue until phase-frequency detector 200 no longer outputs an early comparison signal 252 with sufficient frequency to warrant a decrease in the phase of the recovered clock signal 251, indicating that the recovered clock signal 251 may no longer lag the data signal 250.

In embodiments where the phase controller 220 comprises circuitry to monitor the amplitudes of the interrelated control signals 254, the phase controller 220 may also comprise circuitry to allow discharging of a first charge storage circuit, such as a capacitance circuit, to dominate charging of a second charge storage circuit. In these embodiments, when the amplitude of an interrelated control signal 254 is near or reaches the low amplitude boundary, the highly linear phase interpolator 240 may generate a recovered clock signal 251 substantially equivalent to the reference clock phase 260 associated with the first charge storage circuit, maintaining the recovered clock signal 251 substantially at that phase until the first charge storage circuit is near or reaches the high amplitude boundary. In other embodiments that have a charge circuit dominating a discharge circuit, after a first interrelated control signal 254 reaches a high amplitude boundary and while a second interrelated control signal 254 may be approaching the low amplitude boundary, the highly linear phase interpolator 240 may continue to combine the reference clock phase 260 associated with the first interrelated control signal 254 with the reference clock phase 260 associated with a second interrelated control signal 254, continuing the transition of the recovered clock signal 251.

In other embodiments, the linearity of the recovered clock signal 251, or interpolated clock signal, may be improved by increasing the number of charges and discharges required to accomplish a phase change in the recovered clock signal 251. However, increasing the number of charges and discharges to ramp up an interrelated control signal 254 and ramp down an interrelated control signal 254 may reduce the effective bandwidth of the clock and data recovery feedback loop.

Referring still to FIG. 2, the highly linear phase interpolator 240 may receive reference clock phases 260 separated by less than 180 degrees and may weight or set the amplitudes of the reference clock phases 260 in proportion to the amplitude of an interrelated control signal 254 from phase controller 220. The highly linear phase interpolator 240 may further combine the weighted reference clock phases and filter the combined, weighted reference clock phases to output a recovered clock signal 251 to phase-frequency detector 200.

The highly linear phase interpolator 240 may comprise control current circuitry 245, interpolator circuitry 247 and output circuitry 249. The control current circuitry 245 may comprise circuitry to adjust the gain associated with the reference clock phases 260 via the interpolator circuitry 247. For example, phase control circuit 225 may be associated with a zero degree reference clock phase 260 and may output an interrelated control signal 254 at a low amplitude boundary; phase control circuit 230 may be associated with a 120 degrees reference clock phase 260 and may output an interrelated control signal 254 at a high amplitude boundary; and phase control circuit 235 may be associated with a 240 degree reference clock phase 260 and may output an interrelated control signal 254 at the low amplitude boundary. The interpolator circuitry 247 may combine the weighted reference clock phases to produce a recovered clock signal 251 at a 120-degree phase by applying a gain via the interpolator circuitry 247 based upon the amplitude of the corresponding interrelated control signal 254. In some applications, such as applications that may use sinusoidal interrelated control signals, the combination may produce substantially the same result as a phasor summation (assuming sinusoidal reference clocks) of the weighted reference clock phases. More specifically, the vector components of the weighted reference clock phases at zero degrees, 90 degrees, 180 degrees, and 270 degrees may be reduced to equivalent vector components at 90 degrees and 180 degrees and summing the equivalent vector components may result in a single, resultant vector at 135 degrees.

In many embodiments, control current circuitry 245 may further comprise a degenerative mesh. The degenerative mesh may couple voltage-to-current amplifiers of interpolator circuitry 247, which set or generate weighted, or proportioned, reference clock phases 260, together with substantially equivalent impedances. In other words, the control current circuitry 245 may cause current steering via the degenerative mesh, which may determine phase contributions in a current-mode sense. The degenerative mesh may also make single-ended interrelated control signals, such as voltage signals, act differential or pseudo-differential in one or more quadrants, by facilitating cancellation or attenuation of noise in the control current circuitry 245. In some embodiments, the degenerative mesh may greatly improve linearity of control currents versus control voltages as translated through the phase control circuitry of control current circuitry 245. In many embodiments, the degenerative mesh may help maintain keep alive currents. Further, when control current circuitry 245 may comprise current mirror circuitry to maintain a current to be apportioned through each phase amplifier in accordance with the degenerative mesh and the phase control circuitry.

In some embodiments, the highly linear phase interpolator 240 may further comprise output circuitry 249. The output circuitry 249 may receive the weighted reference clock phases and filter or condition the combination to produce a recovered clock signal 251 with a transitioned or transitioning phase. The output circuitry 249 may comprise a filter such as an integrating filter, a differentiating filter, or a multi-state filter to output a recovered clock signal 251 in a desired format. For example, when a reference clock phase 260 may be a square wave and the interrelated control signals 254 may be ramping signals then the output filter may integrate the combination of weighted reference clock phases to produce a recovered clock signal in the form of a triangular wave. Alternatively, the reference clock phases 260 may be triangular waves or ramping signals and the interrelated control signals 254 may be ramping signals. As a result, a linear combination of the weighted reference clock phases may produce a triangular wave for a recovered clock signal 251. On the other hand, some embodiments may output a square wave type signal for the recovered clock signal 251 using square wave, reference clock phases 260 and sinusoidal, interrelated control signals 254 with a fairly resistive load. In this embodiment, a multi-state filter may be used to remove unwanted tones. In alternative embodiments, where the reference clock phases 260 are sinusoidal, with sinusoidal, interrelated control signals 254 and a fairly resistive load, no post filtering may be necessary. Such a system may combine the weighted reference clock phases like phasor addition.

In alternative embodiments, more than three reference clock phases 260 may be input into the highly linear phase interpolator 240. In some of these embodiments, additional reference clock phases 260 may increase the linearity of the interpolation, increasing the linearity of the phase transfer function of the recovered clock signal 251. In many of these embodiments, the number of phase control circuits in phase controller 220 may be increased to match the number of input reference clock phases 260 for the highly linear phase interpolator 240.

In further embodiments, the phase-frequency detector 200 may comprise frequency tracker circuitry. The frequency tracker circuitry may modify the phase of the recovered clock signal 251 after sampling data from the data signal 250 to increase the accuracy of the data samples. The phase-frequency detector may also comprise a smoothing filter that may base changes off of accumulated differences between early signals and late signals, filtering out high-speed noise. In many of these embodiments, the frequency tracker circuitry may determine or select an update pattern, a pattern based upon prior phase updates, and implement the pattern when there are few or no phase updates. For example, after receiving a phase update that may not match the update pattern, the frequency tracker circuitry may cause the output of the phase-frequency detector to ignore the phase update. On the other hand, during a period lacking phase updates, the frequency tracker circuitry may cause the output of the phase frequency detector to output phase updates based upon the update pattern. In some of these embodiments, the frequency tracking circuitry may compensate for the low frequency jitter. In further embodiments, a second frequency tracker may track higher frequency jitter. Circuitry such as the frequency tracking circuitry may change an inherently first order clock and data recovery loop into a second order clock and data loop. In still further embodiments, the frequency tracker circuitry may be incorporated into the phase update logic circuitry.

Figure 3C:
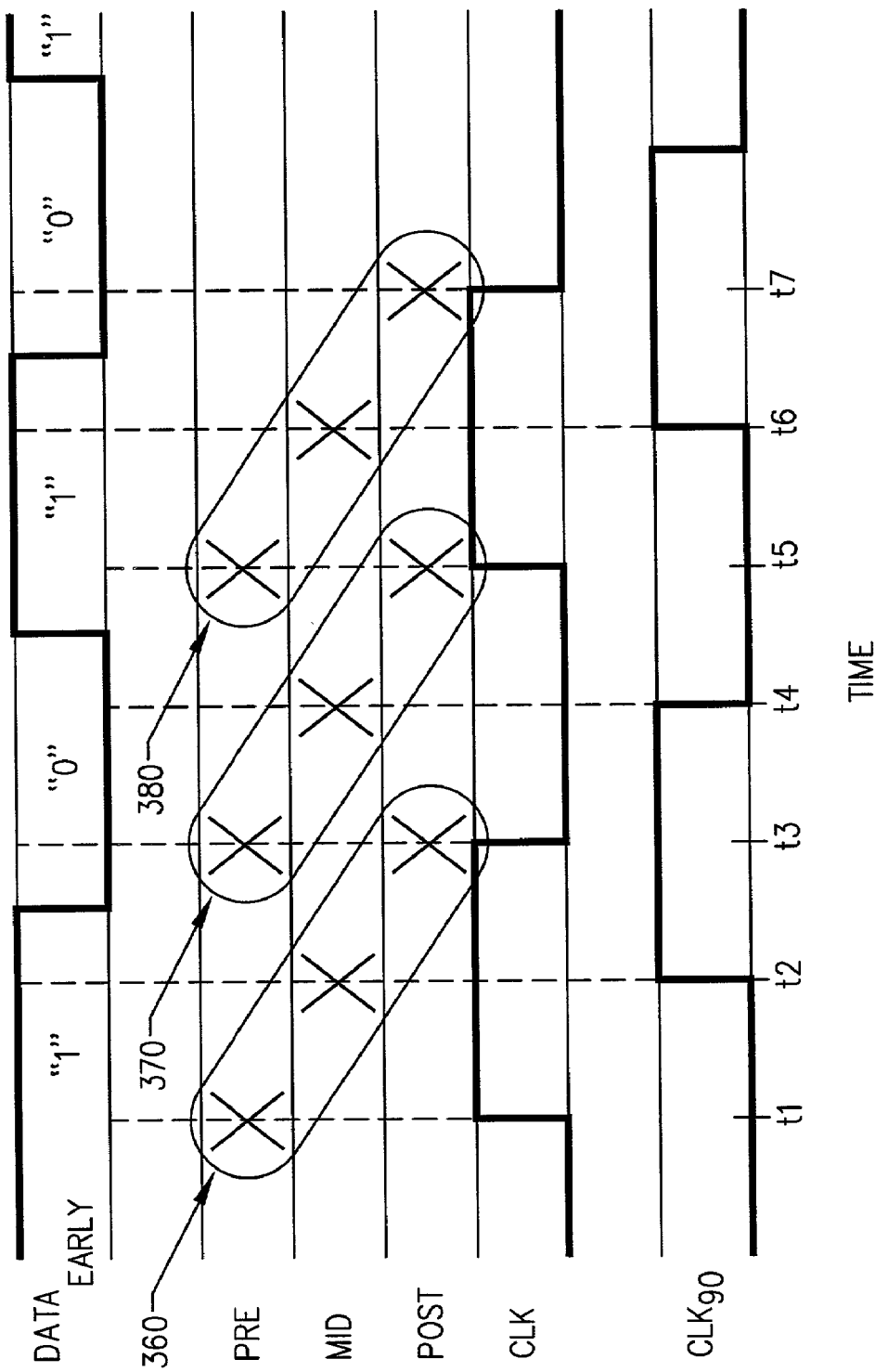

Referring now to FIGS. 3a through 3c, there are shown timing diagrams for sampling data of a data signal and generating a comparison signal in response to the sampling. In particular, FIG. 3a depicts a timing diagram for sampling data (DATA) wherein the phase of an interpolated clock signal (CLK) matches the phase of DATA such that a transition in the sampling clock signal ($CLK_{90}$) occurs in the middle of the a data bit in DATA, such as at T2. In many applications, it may be advantageous to sample data of a data signal in the middle of a data bit since jitter and other noise may reduce the data sampling window for the data bit, to reduce the number of erroneously read data bits over a large number of data bits. The embodiment of FIG. 3a comprises, a data signal, DATA, having alternating data bits of a logical zero and a logical one; a pre-data bit sample indication (PRE), a mid-data bit sample indication (MID), and a post-data bit sample indication (POST); the interpolated clock signal, CLK, and the sampling clock signal, $CLK_{90}$. PRE and POST are the same data sample in this timing diagram, triggered by a transition in CLK. For example, PRE and POST indicate that samples may be taken at T1, T3, T5, and T7. MID may be triggered by a transition in $CLK_{90}$ such as shown at time T2, T4, and T6. The groups of PRE, MID and POST 300, 310 and 320 indicate groups of samples used to determine whether CLK and $CLK_{90}$ lead or lag DATA. For example, for group 300, PRE may indicate a sample of logical one, MID may indicate a sample of logical one and POST may indicate a sample of logical one. Since PRE, MID, and POST indicate a reading of the same data bit, a phase-frequency detector may output a null comparison signal or the phase-frequency detector may output a comparison signal alternating between early and late, to indicate that the phase of CLK may be neither early nor late.

Referring now to FIG. 3b, there is shown a timing diagram similar to the timing diagram in FIG. 3a; however, DATA is replaced by $DATA_{LATE}$ which is the data signal DATA phase shifted to lag CLK, or CLK leads $DATA_{LATE}$. The change in the phase of the data signal, relative to a previously aligned condition, may occur as a result of transmission related, channel related, and/or data and/or clock related noise or jitter. The phase-frequency detector may compare data samples, PRE, MID, and POST, within data sample groups 330, 340, and 350 to determine that CLK leads $DATA_{LATE}$. For example, PRE in data sample group 330 may indicate a data bit of the logical zero, MID may indicate a data bit of a logical one, and POST may indicate a data bit of a logical one. When PRE indicates the data bit different from the data bits indicated by MID and POST, the phase-frequency detector may determine that the transitions in $CLK_{90}$ may not line up with the center of the data bit in $DATA_{LATE}$. At times T3, T5, and T7, an indication that the CLK leads the data signal may be transmitted in the form of an early comparison signal to phase update logic.

Referring now to FIG. 3c, there is shown a timing diagram similar to the timing diagram in FIG. 3a; however, DATA is replaced by $DATA_{EARLY}$, which is the data signal DATA phase shifted to lead CLK, or CLK lags $DATA_{EARLY}$. The phase-frequency detector may compare the results of data sample groups 360, 370, and 380 to determine that PRE and MID may indicate one data bit and POST may indicate a different data bit. As a result, the phase-frequency detector may output a comparison signal indicating that CLK is later than the $DATA_{EARLY}$ or the transition of $CLK_{90}$ may hit the data bit of $DATA_{EARLY}$ at a point later than the middle of the data bit.

In some situations, DATA $DATA_{EARLY}$, and $DATA_{LATE}$ may not alternate between ones and zeros at every transition between data bits in the data signal so the phase-frequency detector sampling data from that data signal may not recognize whether the CLK may be earlier or later at every data transition. For example, in FIG. 3c if $DATA_{EARLY}$ indicated a logical zero bit for each data bit shown, PRE, MID, and POST may indicate a logical zero. In one embodiment, the phase of the recovered or interpolated clock signal may not transition during periods without transitions in the data signal. In many embodiments, such as embodiments with frequency-tracker circuitry, the phase of the recovered clock signal may continue to adjust in accordance with an update pattern determined by the frequency-tracker circuitry.

Referring now to FIG. 4, there is shown a timing diagram for an embodiment of logic to generate charge and discharge signals for a voltage controller in response to high speed early and late signals from a sampling circuit. The embodiment depicts a comparison signal comprising EARLY and LATE signals that may be received by phase update logic from a phase-frequency detector. Charge and discharge signals, Charge VC1, Discharge VC1, Charge VC2, Discharge VC2, Charge VC3, and Discharge VC3, may be output by the phase update logic, in response to the comparison signal, to three different phase control circuits of a phase controller. Overflow signals, Trip Low VC1, Trip High VC1, Trip Low VC2, Trip High VC2, Trip Low VC3, and Trip High VC3, from the phase control circuits of a phase controller may be output to the phase update logic to allow the phase update logic to keep track of the phase control circuits responsible for managing interrelated control signals. The managing interrelated control signals may be the interrelated control signals controlling the amplitude contributions of reference clock phases bounding a recovered or interpolated clock signal. For instance, when the recovered clock signal is at a phase of 45 degrees and is interpolated from reference clock phases of zero degrees, 90 degrees, 180 degrees, and 270 degrees, the managing interrelated clock signals are the clock signals controlling the amplitude contributions of zero degrees and 90 degrees, since the reference clock phases of zero degrees and 90 degrees provide more than a minimum contribution to the phase of the recovered clock signal.

At T0, a phase-frequency detector may output an EARLY pulse to indicate that the data samples at T0 comprise a pre-data bit sample different from the mid-data bit sample and post-data bit sample. In other embodiments, more than two samples may be taken for each data bit in the data signal. At T1 and T2, a comparison signal from the phase-frequency detector indicates that the post-data bit samples may be different from the pre-data bit and mid-data bit samples. After T3, since the present embodiment incorporates an update smoothing filter, the phase update logic may generate a charge and discharge signal, Charge VC2 and Discharge VC1, to update managing interrelated control signals of the voltage controller, after accumulating three pulses in one direction over pulses in the opposite direction from the comparison signal. A pulse for Discharge VC1 is transmitted to the first phase control circuit, a pulse for Charge VC2 is transmitted to the second phase control circuit, and no signal is transmitted to the third phase control circuit.

After receiving the charge and discharge signals at T4, the first phase control circuit may transmit a trip low overflow signal, Trip Low VC1, to the phase update logic to indicate that the managing interrelated control signal output by the first phase control circuit may have reached the low amplitude boundary. A trip high overflow signal, Trip High VC2, may also be transmitted from the second phase control circuit at T4 to indicate that the managing interrelated control signal of the second phase control circuit reached a high amplitude boundary.

Further, at T4, T5, and T6, the phase-frequency detector may transmit LATE comparison signals to the phase update logic. In response, after T6, the phase update logic may issue a discharge signal, Discharge VC2, to the second phase control circuit and a charge signal, Charge VC3, to the third phase control circuit, but no signal to the first phase control circuit since the first control circuit no longer outputs a managing interrelated control signal. In this way, the output of the first phase control circuit may be kept at or near the keep-alive level. In addition, the control signals, charge and discharge, may transmit to the second and third control circuit because the combination of Trip Low VC1 and Trip High VC2 may indicate that the phase of the recovered clock signal is increasing and has reached an upper phase boundary for reference clock phases associated with the managing interrelated control signals (near the phase of a second reference clock signal). Any further increase in phase may be accomplished by interpolating between the second reference clock phase and the third reference clock phase.

At T7, Trip Low VC3 may transition from high to low, indicating that the interrelated control signal output by the third phase control circuit is no longer at the lower amplitude boundary. Similarly, the Trip Low VC2 may transition low to indicate that the interrelated control signal output by the second phase control circuit is no longer at the high amplitude boundary. In some embodiments, Trip Low VC3 and Trip Low VC2 may transition substantially at the same time, but, in other embodiments, Trip Low VC3 and Trip Low VC2 may be designed to and/or capable of transitioning at different times.

In alternate embodiments, the comparison signal from the phase-frequency detector may be a single signal that transitions from high to low to indicate when the phase of the data signal is early or when the phase of the data signal is late with respect to the recovered clock signal. In many of these embodiments, the phase-frequency detector may not indicate when the data sample is in phase with the recovered clock signal so the recovered clock signal may be continuously phase-shifted around the phase of the data signal. In other embodiments, the phase update logic may output a single control signal for the phase controller to charge and discharge. In many such embodiments, the charge and discharge signals are input into one or more multiplexers having selection signals to select the correct phase control circuit for the charge and the discharge signal. In still further embodiments, an interrelated control signal may control the amplitude contribution of reference clock phases in the highly linear phase interpolator.

Figure 5:
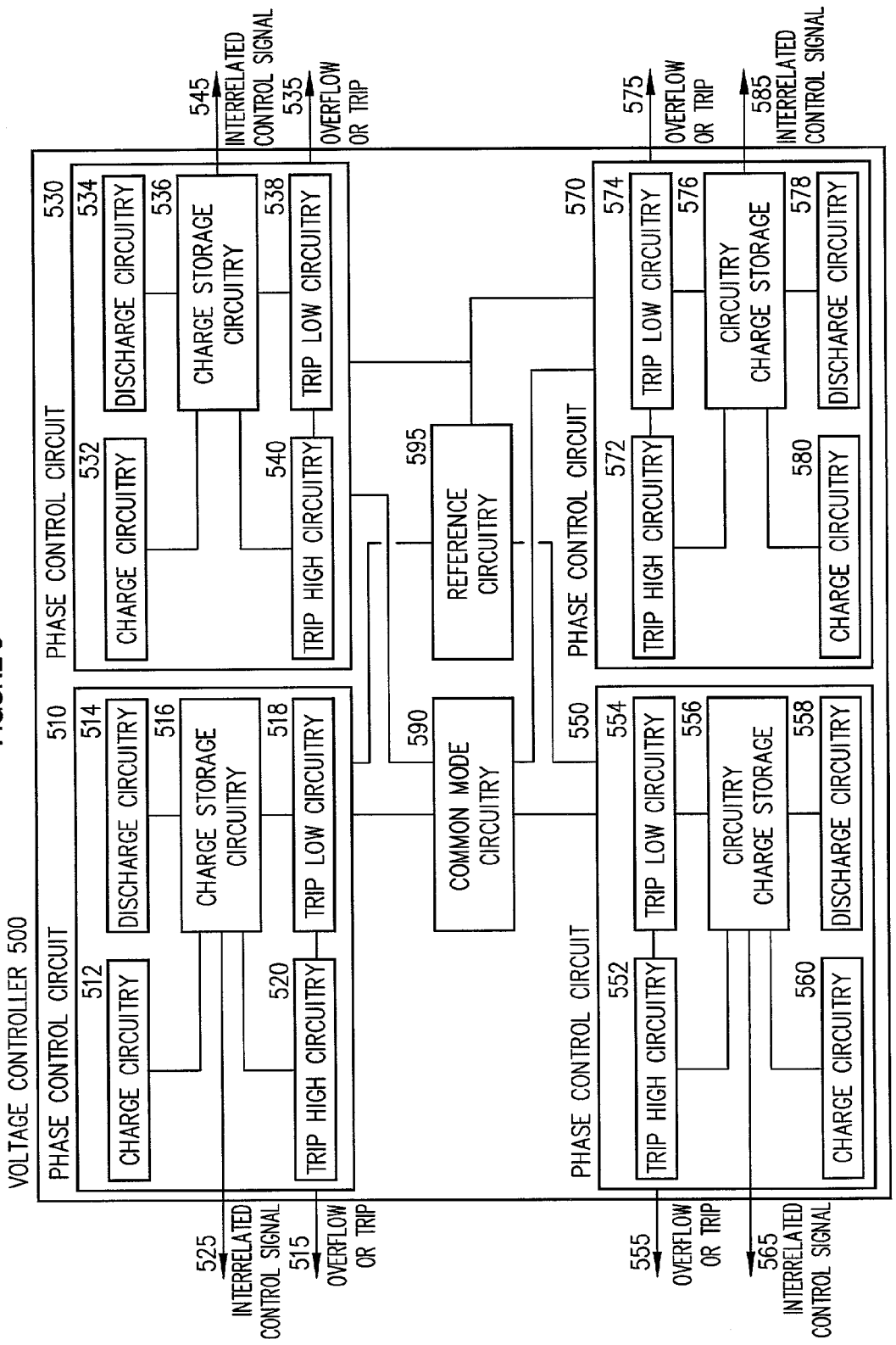
FIG. 5 depicts an embodiment of a voltage controller to generate interrelated control signals for a highly linear phase interpolator.

Referring now to FIG. 5, there is shown an embodiment of a voltage controller to generate interrelated control signals for a highly linear phase interpolator. The voltage controller 500 may be an embodiment of a phase controller that adjusts a voltage amplitude of an interrelated control signal to adjust the weighting of a reference clock phase, in response to a signal indicating the phase of an interpolated clock signal may be increased or the phase of an interpolated clock signal may be decreased. The voltage controller 500 comprises phase control circuits 510, 530, 550, and 570 to output single ended or differential, interrelated control signals to weight amplitude contributions for three or more reference clock phases to an interpolated clock signal, although four reference clock phases is shown. The voltage controller 500 may further comprise common mode circuitry 590 and reference circuitry 595 coupled with each phase control circuit 510, 530, 550, and 570. A phase control circuit 510, 530, 550, and 570 may add charge to or remove charge from corresponding charge storage circuitry 516, 536, 556, and 576, to modify the amplitude of an interrelated control signal 525, 545, 565, and 585 output from phase control circuits 510, 530, 550, and 570, respectively. Phase control circuit 510, as with phase control circuits 530, 550 and 570, may comprise charge circuitry 512, discharge circuitry 514, charge storage circuitry 516 having an output for an interrelated control signal 525, and trip low circuitry 518 and trip high circuitry 520 having an output for an overflow signal 515.

Phase control circuit 510 may be designed to receive instructions to charge or discharge the charge storage circuitry 516. In response to a charge signal, charge circuitry 512 may pulse a finite amount of charge to add charge to charge storage circuitry 516 at a charge rate. On the other hand, when phase control circuit 510 receives a discharge signal, discharge circuitry 514 may remove a finite amount of charge from the charge storage circuitry 516 at a discharge rate that may be substantially equivalent to the charge rate. In some embodiments, the charge circuitry 512 may comprise a P-type or N-type field effect transistor coupled to the charge storage circuitry 516. In many embodiments, the charge circuitry comprises a differential current steering mechanism, such as a current-mode switch, to add charge to charge storage circuitry 516 in response to a differential signal to charge.

Similarly, discharge circuitry 514 may comprise an N-type or P-type field effect transistor and in some embodiments, discharge circuitry 514 may comprise a differential current steering mechanism designed to remove charge from the charge storage circuitry 516 in response to a discharge signal.

In some embodiments, phase control circuit 510 may receive both a charge signal and a discharge signal. In many of these embodiments, the charge and discharge signal received by phase control circuit 510 may be designed to charge one part of the charge storage circuitry 516 and discharge a differential portion of the charge storage circuitry 516.

Charge storage circuitry 516 may be designed to store charge from charge circuitry 512 at a rate substantially equivalent to discharging the charge to discharge circuitry 514. In many embodiments, the charge level stored in charge storage circuitry 516 may be monitored by trip high circuitry 520 and trip low circuitry 518. Trip high circuitry 520 may output an overflow signal 515 in response to the charge level in charge storage circuitry 516 approaching or reaching a high amplitude trip level and trip low circuitry 518 may output an overflow signal 515 in response to the charge level of the charge storage circuitry 516 approaching or reaching a low amplitude trip.

Charge storage circuitry 516, 536, 556, and 576 may be designed to compensate for leakage charge. For example, the charge storage circuitry 516 may be charged by a differential current-steering mechanism having P-type field effect transistors and discharged by a differential current-steering mechanism having N-type field effect transistors. Even though the P-type transistors and the N-type transistors may be off, a leakage charge, such as diffusions, of the P-type transistor may charge the charge storage circuitry 516 while a leakage charge, such as diffusions, via the N-type transistor may discharge the charge storage circuitry 516. When the amplitude of the interrelated control signal 525 is at a low amplitude boundary and the net effect of the charging and discharging due to leakage charge results in a discharge, the amplitude of the interrelated control signal 525 may be dragged well below or pulled well below the low amplitude boundary for the control signal. In some embodiments, it is advantageous to maintain the interrelated control signals 525, 545, 565, and 585 near or above the low amplitude boundary by tying the charge storage circuitry 516, 536, 556, and 576, respectively, to a voltage supply node such as through a conductor, or a current limited signal medium such as a large resistance, or large impedance. The large resistance or impedance, for instance, may be sized to maintain the voltage of the control signal near the boundary, but have a draw insignificant enough to allow the charge to rise while the interrelated control signal is being ramped up toward the high amplitude boundary. In some embodiments, the leakage compensation circuitry such as the large resistance coupled to the low voltage, may be switched out when the voltage of the interrelated control signal is ramped up from the low amplitude boundary, ramped down toward the low amplitude boundary, or maintained at some voltage above the low amplitude boundary.

Overflow signal 515 may comprise more than one signal, in some embodiments, to indicate a trip occurred, as well as whether the trip was low or high. In some embodiments, wherein a phase control circuit 510 comprises a charge storage circuitry 516 that may be differential, the trip high circuitry 520 and trip low circuitry 518 may couple to the output of one side of a differential capacitance circuit of the charge storage circuitry 516 rather than monitoring the differential amplitude.

In some embodiments, allowing the charge circuitry to dominate the discharge circuitry may increase the linearity of an interpolated clock signal, by allowing a continuous transition of the phase of the interpolated control signal in response to phase updates, rather than allowing the transition to stop at a phase, like a dead zone. For example, the interpolated clock signal may be transitioned from a phase between the reference clock phases associated with phase control circuit 510 and phase control circuit 530 to a phase between reference clock phases associated with phase control circuit 530 and phase control circuit 550. When the phase of the interpolated clock signal reaches the phase associated with phase control circuit 510, the interrelated control signal 525 may reach the low amplitude boundary prior to the interrelated control signal 545 reaching the high amplitude boundary. The interrelated control signal 545 may continue to increase in amplitude until reaching the high amplitude boundary, but the interpolated clock signal may remain at the same phase until interrelated control signal 545 may reach the high amplitude boundary since other reference clock phase contributions are at a low boundary. On the other hand, in embodiments where the interrelated control signal 545 reaches the high amplitude boundary prior to the interrelated control signal 525 reaching the low amplitude boundary, the phase of the interpolated clock signal may continue to increase until the interrelated control signal 525 reaches the low amplitude boundary.

In the present embodiment, the interrelated control signals 525, 545, 565, and 585, may depend on one another to transition the interpolated clock signal with a substantially analog transition. For example, phase control circuit 510 may receive a charge signal and phase control circuit 530 may receive a discharge signal at substantially the same time so charge circuitry 512 of phase control circuit 510 may be adding charge to charge storage circuitry 516 to increase the amplitude of the interrelated control signal 525 and discharge circuitry 534 may discharge the charge stored in charge storage circuitry 536 at a substantially equivalent rate of discharge as charge storage circuitry 516 accepts the charge from charge circuitry 512. Thus, the interrelated control signals 525 and 545 may comprise ramping amplitudes with substantially equivalent slopes. In particular, charge storage circuitry 516 may have an initial charge at a low amplitude boundary and may rise to a high amplitude boundary at substantially the same rate that the charge level on charge storage circuitry 536 decreases from a high amplitude boundary to a low amplitude boundary. In many embodiments, the high and low charge boundaries for charge storage circuitry 516, 536, 556, and 576 are substantially equivalent. Further, when phase control circuit 510 and phase control circuit 530 are receiving charge and discharge signals, phase control circuit 550 and phase control circuit 570 may receive no signal or a signal to maintain the current or low charge levels in charge storage circuitry 556 and 576.

Common mode circuitry 590 may be coupled to each phase control circuit 510, 530, 550, and 570 in voltage controller 500. Common mode circuitry 590 may be designed to maintain a common mode voltage between interrelated control signals 525, 545, 565, and 585 maintaining or managing the phase of an interpolated clock signal via a highly linear phase interpolator. For example, when interrelated control signals 525 and 545 are managing control signals, common mode circuitry 590 may maintain the common mode voltage between interrelated control signals 525 and 545. However, common mode circuitry may not maintain a common mode voltage between interrelated control signals 525 and 585, interrelated control signals 565 and 585, or interrelated control signals 545 and 565, since interrelated control signals 565 and 585 may be designed to maintain a low amplitude for interrelated control signals other than the managing interrelated control signals 525 and 545.

Common mode circuitry 590 may maintain a common mode voltage between interrelated control signals, such as 525 and 545, by comparing the actual common mode voltage of interrelated control signals 525 and 545 against a reference common mode amplitude from reference circuitry 595. Continuous-time charging and discharging or discrete-time charging and discharging may maintain a common mode voltage between interrelated control signals 525 and 545. Continuous-time charging and discharging may add charge or remove charge from charge storage circuitry 516 and charge storage circuitry 536, adjusting the amplitudes of interrelated control signals 525 and 545 substantially continuously. Discrete-time charging and discharging may comprise pulsing a signal to charge circuitry or discharge circuitry periodically or at times based on a function or algorithm. In many embodiments, common mode circuitry 590 may comprise charge circuitry and discharge circuitry independent of the charge circuitry and discharge circuitry of the phase control circuits. In other embodiments, common mode circuitry 590 may maintain a common mode voltage between control signals by pulsing the charge circuitry and discharge circuitry in phase control circuits 510 and 530, 550 and 570.

Maintaining a common mode voltage between interrelated control signals may also be advantageous in some applications where charge circuitry is designed to dominate discharge circuitry. For example, charge circuitry may be designed to add a slightly greater charge than discharge circuitry of a phase control circuit or to add charge at a slightly greater rate than the rate used to discharge charge storage circuitry of a phase control circuit. In many embodiments, where charge circuitry 512 dominates discharge circuitry 514 and the phase of an interpolated clock signal attempts to sit at a single phase for a long period of time, the domination of the charge circuitry 512 may slowly increase the charge level on the charge storage circuitry 516, increasing the common mode voltage between interrelated control signal 525 and interrelated control signal 545. Similarly, maintaining the charge level for interrelated control signal 545 may increase the charge level in charge storage circuitry 536. The phase-frequency detector may allow "locked" clocks to dither slightly back and forth around a phase. Thus, the weight ratios for zero degree reference clock signal and the 90 degree reference clock signal may be maintained, but the common mode voltage for interrelated control signal 525 and interrelated control signal 545 may continue to increase until one or both the interrelated control signal 525 and 545 reach a high amplitude boundary.

Reference circuitry 595 may maintain reference voltages for a high amplitude boundary, a low amplitude boundary, and a common mode amplitude. In the present embodiment, the reference circuitry 595 may maintain a high voltage for the high amplitude boundary, a mid range voltage for the common mode voltage, and a low voltage for the low amplitude boundary. In several of these embodiments, reference circuitry 595 may maintain three voltages with a resistive ladder. In alternative embodiments, each phase control circuit 510, 530, 550, and 570 may comprise reference circuitry such as reference circuitry 595. In several embodiments, common mode circuitry 590 may comprise independent circuitry for each potential pair of managing interrelated control signals.

Figure 6:
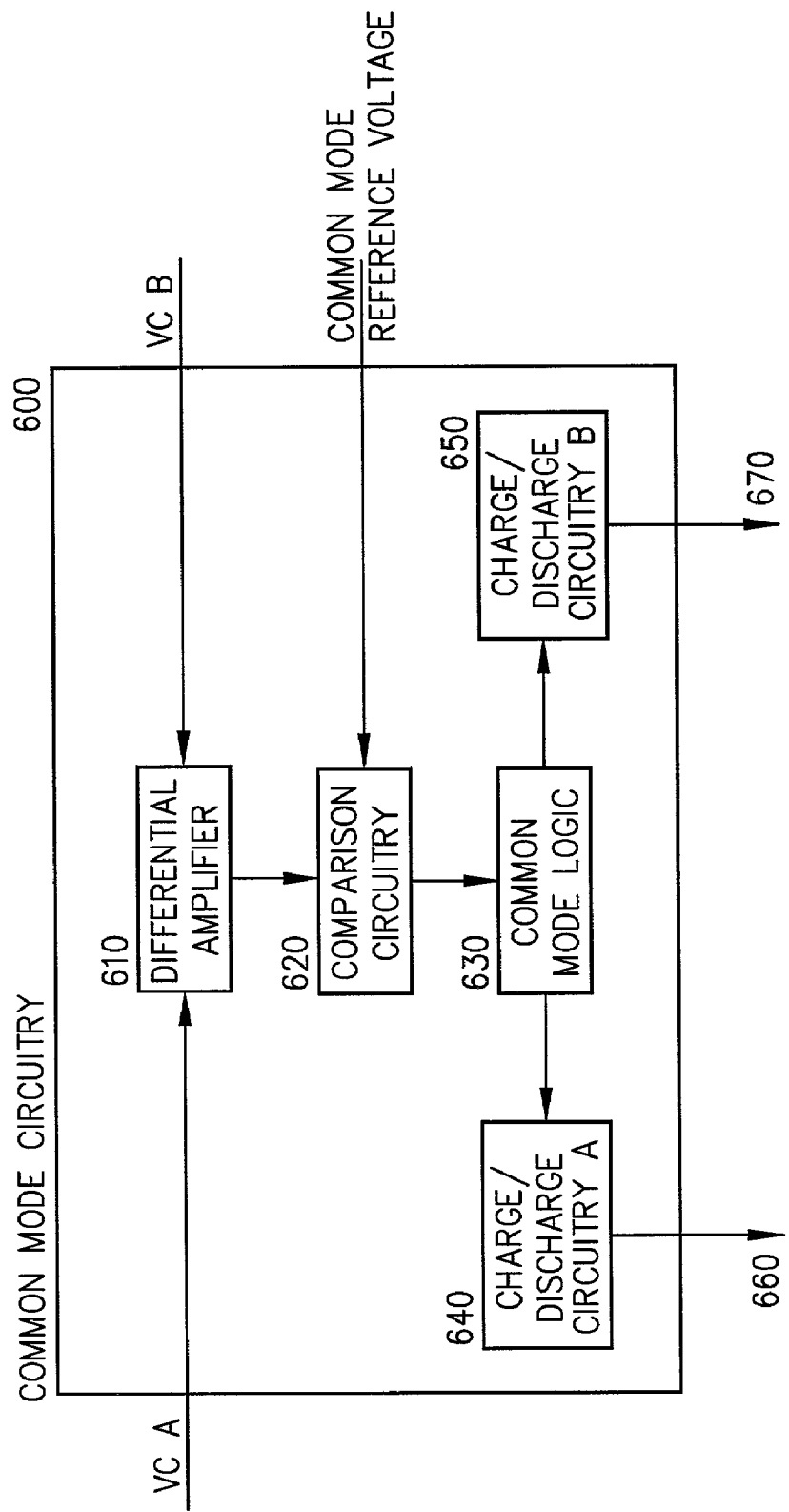
FIG. 6 depicts an example embodiment of circuitry to substantially maintain a common mode voltage between two control signals, VCA and VCB, output by the voltage controller.

Referring now to FIG. 6, there is shown an example embodiment of circuitry to substantially maintain a common mode voltage between two control signals, VCA and VCB, output by the voltage controller. Common mode circuitry 600 may comprise inputs VCA and VCB, differential amplifier 610, comparison circuitry 620, having a common mode reference voltage input, common mode logic 630, charge/discharge circuitry A 640 having an output 660 and charge/discharge circuitry B 650 having an output 670. Differential amplifier 610 may be designed to output common mode voltage of VCA and VCB to comparison circuitry 620. Comparison circuitry 620 may compare the common mode voltage of VCA and VCB against the common mode reference voltage input and when the common mode voltage of VCA and VCB is greater than or less than the common mode reference voltage, comparison circuitry 620 may output the results of the comparison to common mode logic 630. In response, common mode logic 630 may determine whether the charge storage circuitry associated with VCA and VCB may be discharged or charged. Common mode logic 630 may output instructions to charge/discharge circuitry A 640 and charge/discharge circuitry B 650 to make the appropriate adjustments to the charge level of the charge storage circuitry associated with VCA and VCB.

In some embodiments, charge/discharge circuitry A 640 may output a signal 660 to pulse the charge circuitry or discharge circuitry associated with VCA to charge or discharge the corresponding charge storage circuitry. In other embodiments, charge/discharge circuitry A 640 may comprise charging circuitry and discharging circuitry to linearly add or pull a charge from the charge storage circuitry associated with VCA. Similarly, charge/discharge circuitry B 650 may output a pulse charge, or discharge signals, or linearly add or pull charge, to add or remove charge from a charge storage circuitry associated with VCB.

In alternate embodiments, common mode circuitry 600 may comprise circuitry to compare amplitudes of current as interrelated control signals. In further embodiments, common mode circuitry 600 may comprise circuitry to track the interrelated control signals managing the phase of the interpolated clock signal and associate inputs VCA and VCB with the appropriate interrelated control signals. In many of these embodiments, the inputs VCA and VCB may be coupled with the managing interrelated control signals via a multiplexer having a selection signal to track the managing interrelated control signals. In still other embodiments, common mode circuitry 600 may be coupled to each potential pair of interrelated control signals and comprise logic to block the outputs 660 and 670 when VCA and VCB may not be the managing interrelated control signals.

Figure 7:
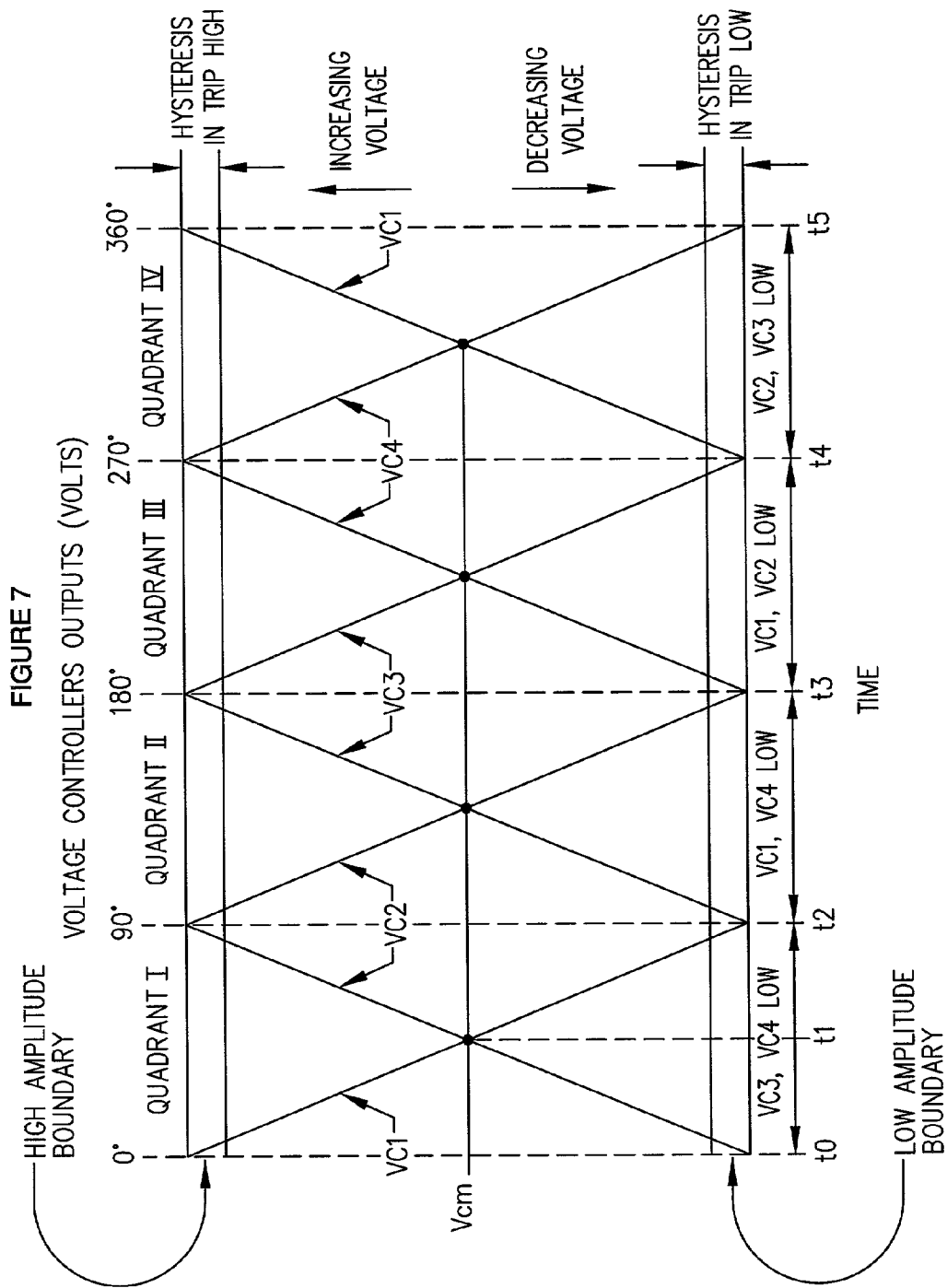
FIG. 7 depicts an embodiment of a timing diagram of an output of a voltage controller having four interrelated control signals to transition the phase of an interpolated clock signal from zero degrees to 360 degrees.

Referring now to FIG. 7, there is shown an example timing diagram of an output of a voltage controller having four interrelated control signals to transition the phase of an interpolated clock signal from zero degrees to 360 degrees. The timing diagram shows the voltage of interrelated control signals VC1, VC2, VC3, and VC4 as the phase of an interpolated clock signal output by a phase interpolator progresses from zero degrees to 360 degrees. At T0, VC1 has an initial amplitude set at the high amplitude boundary and the remaining control signals, VC2, VC3 and VC4 are at the low amplitude boundary. As a result, the initial phase of the interpolated clock signal may be zero degrees or in phase with the zero degree reference clock signal. Between T0 and T1 discharge circuitry associated with interrelated control signal VC1 may discharge the charge storage circuitry controlling the amplitude of VC1 down to the common mode voltage ($V_{CM}$) at T1. Substantially simultaneously, charge circuitry may increase the charge on the charge storage circuitry associated with VC2 up to $V_{CM}$. Meanwhile, the amplitudes of VC3 and VC4 are maintained at the low amplitude boundary since VC3 and VC4 may not be managing interrelated control signals.

At T1, the interpolated clock signal may have a phase of 45 degrees since the amplitude contribution of the zero degree reference clock phase and the 90 degree reference clock phase to the interpolated control signal are proportional to the substantially equivalent amplitudes of VC1 and VC2 and the amplitude contributions of the 180 degree reference clock phase and the 270 degree reference clock phase are proportional to the low amplitudes of VC3 and VC4. Between T1 and T2, VC1 may be discharged to the low amplitude boundary at a substantially equivalent rate as VC2 may be charged to the high amplitude boundary. In some embodiments, the charging circuitry of interrelated control signals such as VC2 may dominate the discharging circuitry of interrelated control signals such as VC1 such that VC2 may reach the high amplitude boundary before VC1 reaches the low amplitude boundary. As VC2 approaches T2, the amplitude of VC2 enters a hysteresis in trip high voltage range. The hysteresis in trip high voltage range indicates a range of voltage dedicated to prevent chatter in an overflow signal. The overflow signal may be transmitted from trip circuitry when a control signal such as VC2 is near or reaches an amplitude boundary. In these embodiments, the overflow signal may chatter when VC2 is maintained near the edge of the amplitude boundary unless hysteresis circuitry is incorporated with the trip circuitry. For example, VC2 may trip the high voltage overflow signal when VC2 reaches the high amplitude boundary; however, the overflow signal may continue to indicate a trip for VC2 until the amplitude of VC2 reduces below the hysteresis in trip high voltage range. In other embodiments, circuitry for hysteresis in trip high and/or hysteresis in trip low may not be incorporated into the trip circuitry. Thus, when an interrelated control signal such as VC2 may be maintained at 90 degrees, for example, the interrelated control signal may dither back and forth between the high amplitude boundary and some voltage slightly less than the high amplitude boundary causing the overflow signal to transmit a trip high indication multiple times. The hysteresis in trip low circuitry operates in a similar manner when an interrelated control signal may be maintained at a low amplitude.

At T2, VC2 begins at the high amplitude boundary as a result of the transition from zero degrees to 90 degrees of the interpolated clock signal. Between T2 and T3, while the phase of the interpolated clock signal is transitioned from 90 degrees to 180 degrees, VC1 and VC4 remain near the low amplitude boundaries and VC3 ramps up toward the high amplitude boundary. At T3, VC2 may be at the low amplitude boundary while VC3 is at the high amplitude boundary, weighting the reference clock phases such that the interpolated clock signal may be approximately at a 180 degrees phase at T3.

Between T2 and T4, VC1 is maintained at a low amplitude boundary and the charge on the charge storage circuitry associated with VC1 may be modified by a leakage charge. In some embodiments, leakage compensation circuitry may be incorporated to remove or attenuate the effects of leakage.

Between T3 and T5 the phase of the interpolated clock signal may be transitioned from 180 degrees through 360 degrees with a substantially linear and analog phase transition. In alternate situations, the phase of an interpolated clock signal may ramp or transition to a lower phase. When transitioning from 180 degrees to 90 degrees for example, VC3 would ramp down from the high amplitude boundary to a low amplitude boundary, and VC2 would ramp up from the low amplitude boundary to the high amplitude boundary while VC1 and VC4 remain at the low amplitude boundaries for the interrelated control signals.

Figure 8:
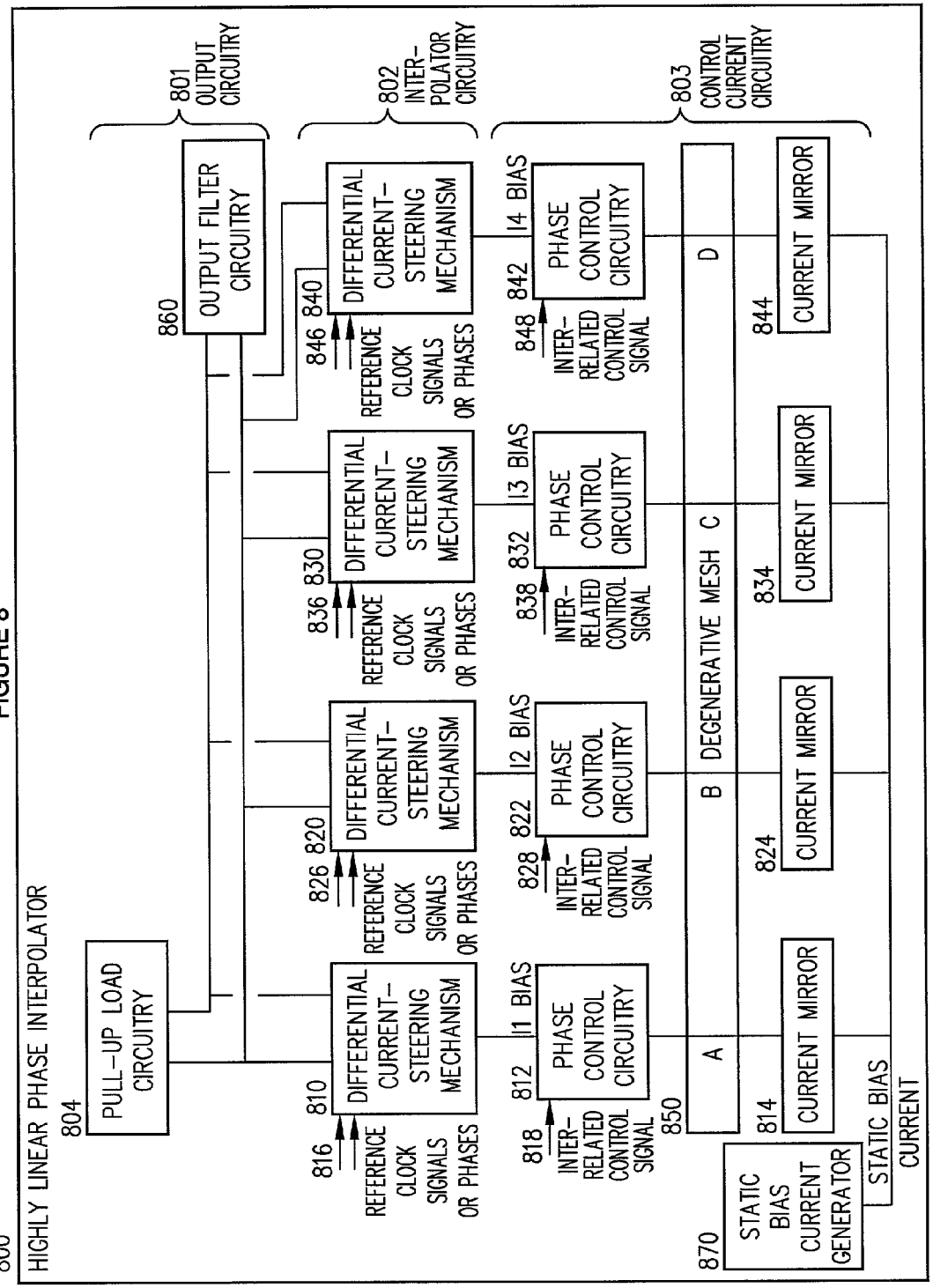
FIG. 8 depicts an example embodiment of circuitry to transition an interpolated clock signal with analog phase transitions between four phases of a reference clock signal.

Referring now to FIG. 8, there is shown an example embodiment of circuitry to transition an interpolated clock signal with analog phase transitions between four phases of a reference clock signal. The highly linear phase interpolator

800 may comprise control current circuitry 803, interpolator circuitry 802, and output circuitry 801. The control current circuitry 803 may receive interrelated control signals to adjust the weighting of reference clock signals of different phases. Interpolator circuitry 802 may receive the reference clock signals of different phases and may be coupled with the control current circuitry 803 to adjust the amplitudes of the reference clock signals. Output circuitry 801 may be coupled with interpolator circuitry 802 to combine the weighted reference clock signals and filter the combined signal to output an interpolated clock signal.

Output circuitry 801 may comprise pull-up load circuitry 804 coupled to output filter circuitry 860. Pull-up load circuitry 804 may comprise frequency dependent and/or independent, active and/or passive elements. For instance, pull-up load circuitry 804 may comprise two pull-up resistors having closely matched resistances coupled between a high circuit voltage supply node, such as $V_{DD}$, and the interpolator circuitry, as well as between the high voltage circuit supply node and the output filter circuitry 860. The pull-up load circuitry 804 may translate the current outputs of differential current-steering mechanisms 810, 820, 830, and 840 of interpolator circuitry 802 into a combined voltage signal or unfiltered recovered clock signal. In many embodiments, the pull-up load circuitry 804 may comprise closely matched impedances to maintain substantially equivalent swing ranges for the two inputs of the differential current-steering mechanisms 810, 820, 830, and 840, to prevent a transistor of one of the differential current-steering mechanisms 810, 820, 830, and 840 from operating in triode region at a different voltage than a second transistor in the same differential current-steering mechanism may enter a triode region of operation. For example, differential current-steering mechanism 810 may pull current I1 bias through parallel impedances of pull-up load circuitry 804. The portion of I1 bias pulled through each impedance may be based upon the amplitudes of the transitioning voltage signals of two reference clock signals 816, such as reference clock phases of zero degrees and 180 degrees. In other words, changing amplitudes of the reference clock phases may steer I1 bias to generate a differential voltage signal. Similarly, differential current-steering mechanisms 820, 830 and 840 may vary current through impedances of pull-up load circuitry 804 based upon current steering in accordance with the changing amplitudes of reference clock signals 826, 836, and 846, respectively. In some embodiments, when reference clock signals 816 may represent reference clock phases of zero and 180 degrees, reference clock signals 826 may represent reference clock phases of 90 degrees and 270 degrees, reference clock signals 836 may represent reference clock phases of 180 degrees and zero degrees and reference clock signal 846 may represent reference clock phases of 270 degrees and 90 degrees.

The differential current-steering mechanism 810, 820, 830, and 840 may amplify or weight their respective reference clock phases based upon the bias current between the differential current-steering mechanisms and the control current circuitry 803. For example, differential current-steering mechanism 810 may output a small or fractional amplitude contribution for reference clock signals 816 when I1 BIAS is a low current, such as a keep-alive current. On the other hand, when I1 BIAS is a high current, differential current-steering mechanism 810 may output a high or relatively high fractional amplitude contribution for the reference clock phases 816. In several embodiments, the transistors of each differential current-steering mechanism 810, 820, 830, and 840 may be sized based upon the reference clock signals, the static bias generator output, and/or the amplitudes of the interrelated control signals.

The outputs of differential current-steering mechanisms 810, 820, 830, and 840 may draw currents through the differential pair of resistive loads in pull-up load circuitry 804 so the output filter circuitry 860 receives a differential voltage signal resulting from a combination of the currents of differential current-steering mechanisms 810, 820, 830, and 840. The output filter circuitry 860 may filter the differential voltages and/or currents with capacitance circuitry to integrate the signal and output an interpolated clock signal.

The control current circuitry 803 may provide the bias currents coupled with the interpolator circuitry 802, the values of which are maintained by control current circuitry 803, to control the bias current through each differential current-steering mechanism 810, 820, 830 and 840, to maintain the differential current-steering mechanism in an active region of operation and to adjust the amplitude contributions of the reference clock signals 816, 826, 836, and 846, by the differential current-steering mechanisms 810, 820, 830 and 840. In particular, the control current circuitry 803 may comprise a static bias current generator 870 to draw a direct-current (DC) bias current through each differential current-steering mechanism. The bias current generated by the static bias current generator 870 may be mirrored into each differential current-steering mechanism circuit with current mirror circuitry 814, 824, 834, and 844, such as a transistor. The magnitude of the current pulled through each differential current-steering mechanism may be based upon tight control of the amplitudes of the interrelated control signals as apportioned via degenerative mesh 850. The bias current drawn through each differential current-steering mechanism 810, 820, 830 and 840 may maintain the transistors of each differential current-steering mechanism 810, 820, 830 and 840 in an active region of operation and, further, maintaining a constant capacitance between the gate or base of each transistor in the differential current-steering mechanisms and the channel or substrate of each transistor. In alternative embodiments, when the minimum bias current may not be maintained through the channels of the transistors of the differential current-steering mechanisms, a transistor may move outside an active operating region and the capacitance may drop off significantly between the base or gate and the substrate. As a result of the change in input impedance, the stability of the reference clock signals coupled to the bases or gates of the differential current-steering mechanism may phase shift. Phase shifts in the reference clock signals may cause differential non-linearities in the phase response of the interpolated clock signal output by those embodiments.

Phase control circuitry 812, 822, 832, and 842 may receive interrelated control signals to adjust the current contribution of each reference clock phase of differential current-steering mechanisms 810, 820, 830, and 840, respectively. For example, phase control circuitry 812 may comprise a field effect transistor (FET) and interrelated control signal 818 may comprise a ramping voltage signal. The current mirror 814 draws a bias current from pull-up load circuitry 804 through differential current-steering mechanism 810 and through the channel of the FET of phase control circuitry 812. When the ramping voltage control signal of interrelated control signal 818 increases in voltage, the bias current I1 BIAS through differential current-steering mechanism 810 may increase and the increase may increase the relative contribution of the reference clock signals 816. In alternative embodiments, phase control circuitry 812, 822, 832, and 842 may comprise differential amplifiers and receive differential interrelated control signals.

Degenerative mesh 850 may interconnect the phase control circuitry 812, 822, 832, and 842. In particular, degenerative mesh 850 may comprise six substantially equivalent impedances interconnecting nodes A, B, C, and D. The degenerative mesh 850 may scale down the differential transconductance of transistors in the phase control circuitry by a factor related to the impedances of the degenerative mesh 850. Scaling down the transconductance broadens the linear operating region or small signal region of the transfer function for e translating the interrelated control signals into current signals so a larger dynamic range of inputs have linear outputs, maintaining a small signal response over a larger range of inputs. The degenerative mesh 850 may provide a pseudo differential response for managing interrelated control signals such as 818 and 828 when the phase of the interpolated clock signal is being managed by reference clock signals 816 and 826. For example, when the managing interrelated control signals comprise 818 and 828 and the phase control circuitry 812 and 822 comprise transistors having the interrelated control signals 818 and 828 applied to gates of the transistors, the impedance of the degenerative mesh between phase control circuitry 812 and 822 may act as degenerative impedances for a differential amplifier, wherein the interrelated control signals 818 and 822 may be inputs. The pseudo-differential response may provide highly linear control of the bias currents, I1 BIAS, I2 BIAS, I3 BIAS, and I4 BIAS, to steer through clock phases via interpolator clock circuitry 802. Further, the pseudo-differential response may cancel or attenuate common mode noise in the interrelated control signals.

In some embodiments, the degenerative mesh 850 may not be incorporated. In many of these embodiments, some other means of linearly controlling the bias currents for the interpolator circuitry 802 with a voltage may be employed. In other embodiments, degenerative pulling may increase with other degeneration techniques. Degenerative pulling describes a situation where currents are induced in phases having low bias currents, such as a keep alive current. For example, when the interpolated clock signal may reside between zero degrees and 90 degrees and phase control circuitry 812 and 822 may manage the phase between zero degrees and 90 degrees, I3 BIAS and I4 BIAS may have unwanted currents induced by degeneration resistors coupling phase control circuitry 832 and 842 to phase control circuitry 812 and 822.

Figure 9:
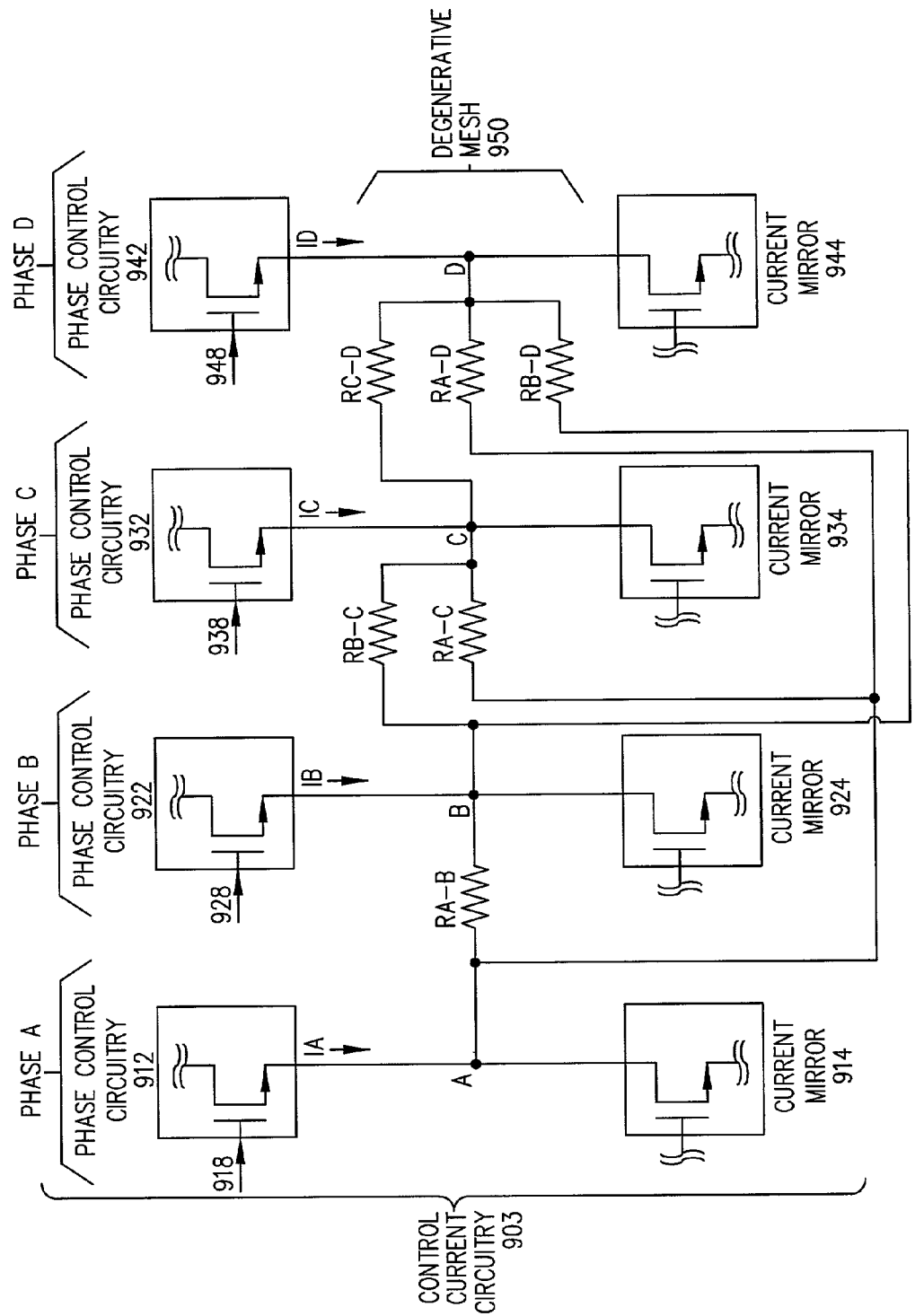
FIG. 9 depicts an embodiment of circuitry to adjust the amplitude contributions of reference clock phases to an interpolated clock signal by controlling bias currents of differential current-steering mechanisms of a highly linear phase interpolator.

Referring now to FIG. 9, there is shown an embodiment of circuitry to adjust the amplitude contributions of reference clock phases to an interpolated clock signal by controlling bias currents of differential current-steering mechanisms of a highly linear phase interpolator. The current control circuitry 903 may control the weighting of reference clock signals associated with phase A, phase B, phase C, and phase D. Current control circuitry 903 may comprise phase control circuitry 912, 922, 932 and 942, current mirrors 914, 924, 934, and 944, and degenerative mesh 950. Phases A, B, C, and D, of the control current circuitry 903, may operate in a substantially similar manner to control the bias currents $I_A$, $I_B$, $I_C$, and $I_D$. For example, current mirror 914 may pull a current through phase A. Phase control circuitry 912 may regulate the amount of current pulled through phase A, $I_A$, based upon interrelated control signal 918 wherein the interrelated control signal 918 may be a control signal bounded by an upper and lower amplitude. In many embodiments, the lower amplitude may bound $I_A$ to a current near or at the keep-alive current and the upper amplitude may bound $I_A$ such that $I_A$ may remain substantially within the small signal characteristic of pseudo-differential operation with other phase control devices and the degenerative mesh.

The degenerative mesh 950 may interconnect each phase with a substantially equivalent resistance. In the present embodiment, resistances $R_{AB}$, $R_{AC}$, $R_{AD}$, $R_{BC}$, $R_{BD}$, and $R_{CD}$ are substantially equivalent resistances. The degenerative mesh 950 interconnections between phase A, phase B, phase C and phase D may facilitate pseudo differential control of the bias currents $I_A$, $I_B$, $I_C$, and $I_D$, giving benefits of noise cancellation between interrelated control signals 918, 928, 938, and 948. The degenerative mesh 950 may also improve linearity between voltages of interrelated control signals 918, 928, 938, and 948, and the corresponding bias currents, $I_A$, $I_B$, $I_C$, and $I_D$.

The bias currents $I_A$, $I_B$, $I_C$, and $I_D$ drawn through phase control circuitry 912, 922, 932, and 942 may be apportioned from and dependent upon the amount of current pulled by each current mirror 914, 924, 934, and 944. In many embodiments, $I_A$, for instance, when interrelated control signal 918 is at a high amplitude boundary, may exceed the current pulled by current mirror 914 so the remainder of the current drawn through phase control circuitry 912 may be apportioned among current mirrors 924, 934, and 944. Further, when interrelated control signal 928 is above a low amplitude boundary, the contribution of current mirror 924 to phase control circuitry 912 may be dependent upon the portion of $I_B$ drawn by current mirror 924.

Figure 10:
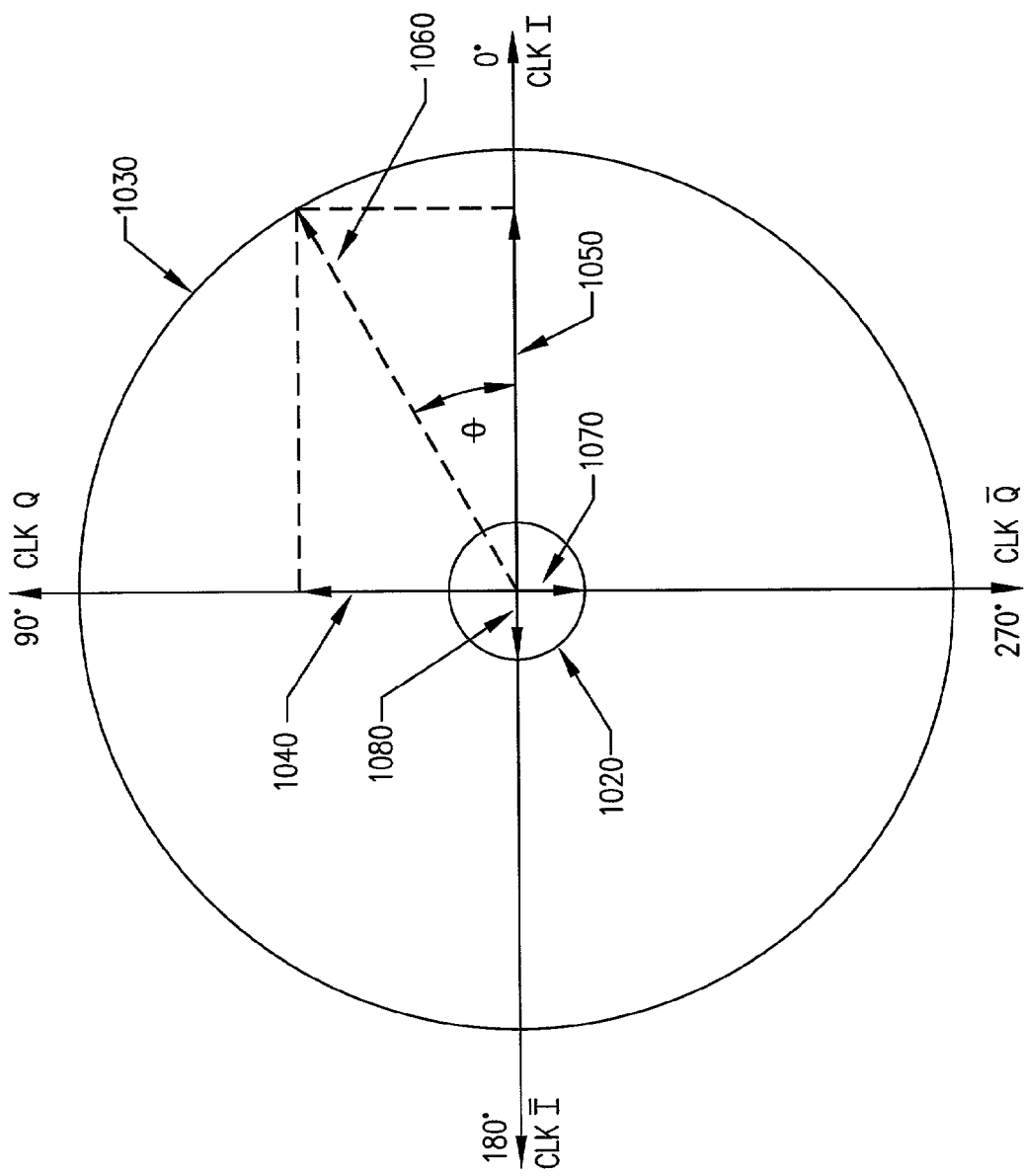
FIG. 10 depicts an embodiment of phase interpolation when four phases of a reference clock, 90 degrees apart, are used to interpolate a clock signal.

Referring now to FIG. 10, there is shown an example of phase interpolation when four phases of a reference clock, 90 degrees apart, may be used to interpolate a clock signal. FIG. 10 depicts phasors 1040, 1050, 1070 and 1080 that may be combined to generate an interpolated clock signal 1060. The circle 1030 may represent a high amplitude boundary, for a reference clock phase output by a differential current-steering mechanism weighted by the bias currents I1 BIAS, I2 BIAS, I3 BIAS, and I4 BIAS (of FIG. 8). Circle 1020 may represent a low amplitude boundary for output reference clock phases to maintain transistors of differential current-steering mechanisms in an active operating region (keep alive level) to reduce input clock phase shifting. In the present embodiment, CLK I and CLK Q are managing the phase of the interpolated clock signal 1060. The interpolated clock signal 1060 is the resultant of a vector summation of vector 1050 representing a zero degree reference clock phase, vector 1040 representing a 90-degree reference clock phase, vector 1080 representing a 180-degree reference clock phase, and vector 1070 representing a 270-degree reference clock phase. The use of phasor diagrams may represent sinusoidal based reference clock contributions and cosine based transfer functions for control currents I1 BIAS, I2 BIAS, I3 BIAS, and I4 BIAS (of FIG. 8).

Some embodiments comprise triangular wave or ramping, reference clock current contributions summed with linear summation or square wave clock currents that may be integrated and summed with linear summation. In these embodiments, referring to FIG. 10 for illustrative purposes concerning ramping waveforms, when the interpolated clock signal, vector 1060, may be transitioning between phases of zero degrees to 90 degrees, the phase transitions may be maintained substantially linear in vector 1060 with linear changes in the amplitudes of vectors 1050 and 1040 via the interrelated control signal associated with CLK I and CLK Q. The interrelated control signal for CLK I may decrease at a rate substantially equivalent to the rate that the interrelated control signal for CLK Q increases, decreasing the amplitude of the vector 1050 for CLK I at substantially the same rate as increasing the amplitude of the vector 1040 for CLK Q.

In some embodiments, amplitude increases in one reference clock phase, such as for the interrelated control signal for CLK Q may dominate the amplitude decreases in a second reference clock phase, such as for the interrelated control signal associated with CLK I. As a result, a situation in which vector 1050 may reduce to circle 1020 and cancel out vector 1080 prior to vector 1040 reaching circle 1030, may be avoided or attenuated. Such a situation may cause a dead zone in the phase response of the resultant clock signal, or the interpolated clock signal.

Figure 11:
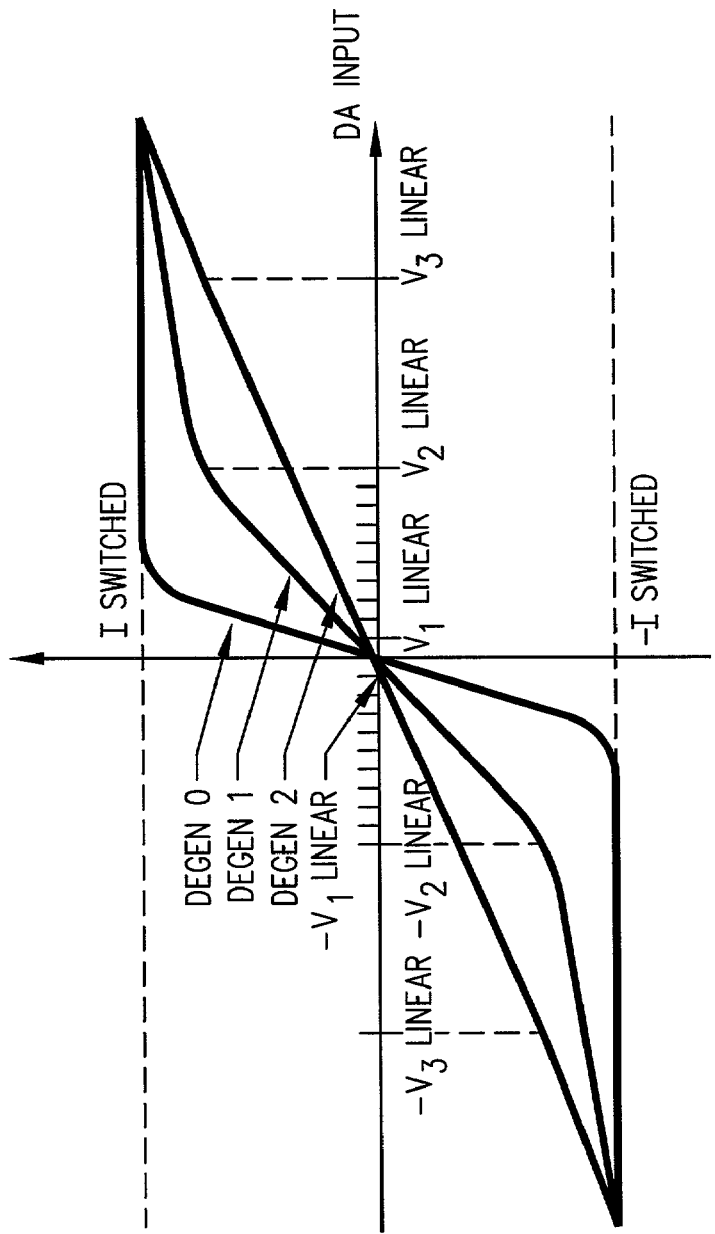
FIG. 11 depicts an embodiment of a small signal region of a differential current-steering mechanism swing range and the effect of degeneration on the transfer function of an embodiment of a highly linear phase interpolator.

Referring now to FIG. 11, there is shown a linear region or small signal region of a pseudo-differential amplifier swing range and the effect of degeneration on the transfer function for the voltage to current translation of interrelated control signals in an embodiment of a highly linear phase interpolator. The vertical axis represents the current output of a pseudo-differential amplifier based upon the bias current and the degeneration impedances, and the horizontal axis represents the input voltage. The transfer function may be a product of the emitter or source currents pulled from the pseudo-differential amplifier, the differential input voltage applied, and the equivalent degeneration impedance for the pseudo-differential amplifier, etc. The degeneration impedance may be based upon the impedances used in a degenerative mesh scheme. The horizontal dashed lines above and below the transfer characteristics of the pseudo-differential amplifier demark the boundaries between the small signal region and cutoff regions, or switched regions, of the output of the pseudo-differential amplifier. Three different degeneration schemes, $DEGEN_0$, $DEGEN_1$, and $DEGEN_2$ are exemplified in FIG. 11. $DEGEN_0$ represents a degeneration scheme with no degeneration and the swing range, or small signal region of operation, for the input voltages range between negative V1 linear and V1 linear. Thus, when a pair of interrelated control signals exceeds a differential voltage magnitude of V1 linear, the current output, as depicted, of the pseudo-differential amplifier may be in a switched region and the interpolated clock signal based upon a pair of interrelated control signals exceeding the V1 linear swing range would have greater differential non-linearity in the output phase response.

$DEGEN_1$ shows the transfer function resulting from a degeneration scheme having degenerative impedance to degenerate the source or emitter of the pseudo-differential amplifier. The small signal region of operation ranges between–V2 linear and V2 linear. Similarly, $DEGEN_2$ has a larger degenerative impedance and the small signal region of operation for interrelated control signals range from–V3 linear to V3 linear.

Depending upon the degeneration scheme of an embodiment, interrelated control signals from a phase controller may be bound based upon the small signal region of operation for the pseudo-differential amplifier, to change the phase of the interpolated clock signal with a substantially analog, or linear, transition in phase.

Figure 12:
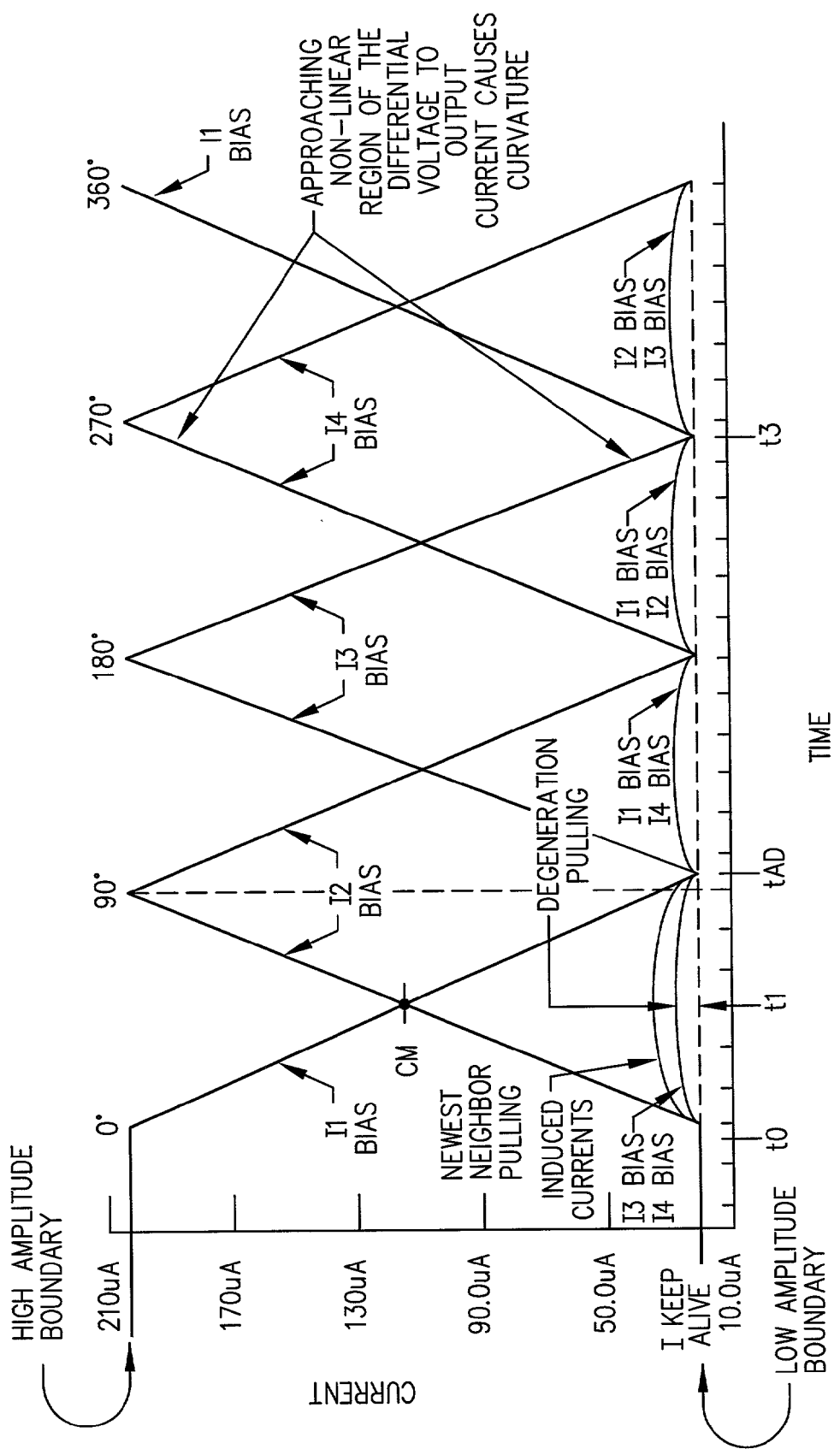
FIG. 12 depicts an embodiment of a timing diagram of bias currents of a highly linear phase interpolator with four input reference clock phases, 90 degrees apart, between zero degrees and 360 degrees.

Referring now to FIG. 12, there is shown bias currents for four differential current-steering mechanisms as the phase of an interpolated clock signal is transitioned from zero degrees to 360 degrees. The vertical axis may depict the amplitude of the bias current and the horizontal axis may depict time. The horizontal dashed line near the time axis indicates the keep alive current. The keep alive current is the minimum current to maintain the differential current-steering mechanisms of the phase interpolator in an active region such that the capacitance at the gate of a FET at the input of a differential current-steering mechanism may remain substantially constant. When the capacitance at the input of the differential current-steering mechanism begins to vary, the reference clock signal inputs may shift in phase, in some embodiments.

At T0, the amplitude of the interrelated control signal associated with the zero degree reference clock phase may be at a high amplitude boundary and the control signal associated with the 90 degree reference clock phase may be at a low amplitude boundary. Between T0 and T1, as the control signal associated with the zero degree reference clock phase decreases and the 90 degree reference clock phase increases, I1 BIAS, the bias current for the differential current-steering mechanism associated with the zero degree reference clock phase, may decrease at a rate substantially equivalent to the rate that the bias current for the differential current-steering mechanism associated with the 90 degree reference clock phase, I2 BIAS. At the same time, in one embodiment, currents may increase with nearest neighbor degeneration (degeneration resistors only between devices that can operate together when transitioning through all quadrants) in the differential current-steering mechanisms associated with the 180-degree reference clock phase and the 270 reference clock phase, I3 BIAS and I4 BIAS. The degeneration pulling shown at T1 shows the currents induced in I3 BIAS and I4 BIAS and the reduction by degenerative mesh over the nearest neighbor degeneration of the pulling currents by a factor of four or five. Degeneration pulling may result from the apportionment of current pulled through each differential current-steering mechanism, I1 BIAS, I2 BIAS, I3 BIAS, and I4 BIAS, by current mirror circuitry in accordance with the impedances set up by the degenerative mesh.

From T1, the control current signals associated with the zero degree reference clock phase and the 90-degree reference clock phase reduce and increase from substantially equivalent amplitudes to the low amplitude boundary and high amplitude boundary, respectively. The time difference illustrated by the vertical lines demarked by Tad, amplitude dominance of increasing control signal, may show the dominance of, for example, a charging circuit over a discharging circuit in a voltage controller. Amplitude dominance may assure that the amplitude of the increasing control signal may reach the high amplitude boundary prior to the decreasing control signal reaching the low amplitude boundary to prevent a dead zone in the interpolated clock signal. The dead zone is a zone during a transition of an interpolated clock signal, for instance, from the quadrant of zero to 90 degrees to the quadrant of 90 degrees to 180 degrees of phase, that the interpolated clock signal holds at a particular phase such as 90 degrees for a short time period although phase updates may be intended to cause the phase of the interpolated clock signal to increase or decrease in phase. For example, when the amplitude of the increasing interrelated control signal reaches a high amplitude boundary prior to the amplitude of the decreasing interrelated control signal reaching the low amplitude boundary, the interpolated clock signal phase may continue to transition because the reference clock phases associated with the interrelated control signals continue to contribute to the phase of the interpolated clock signals. On the other hand, when the decreasing control signal reaches the low amplitude boundary prior to the increasing interrelated control signal reaching the high amplitude boundary, the reference clock phase associated with the interrelated control signal at the low amplitude boundary may not contribute to the phase of the interpolated clock signal because it may be cancelled with the phases 180 degrees out of phase with the interrelated control signal at the low amplitude boundary, as both may be at the keep alive level which may cancel. So the phase of the interpolated clock signal may remain at the reference clock phase of the increasing control signal until the increasing control signal reaches the high amplitude boundary.

As the bias currents approach the non-linear region for the transfer characteristic of the pseudo-differential voltage to current conversion of the phase control circuitry used to generate control currents for interpolating a clock signal, the transfer characteristic starts to deviate from linear with a slight curvature, as illustrated at T3. In the present embodiment, the slight curvature in the bias currents, I3 BIAS and I4 BIAS at T3, may also be in the relative contributions of the clock phases of the differential current-steering mechanisms causing differential non-linearities in the phase transfer function of the interpolated clock signal, or resultant clock signal.

Figure 13:
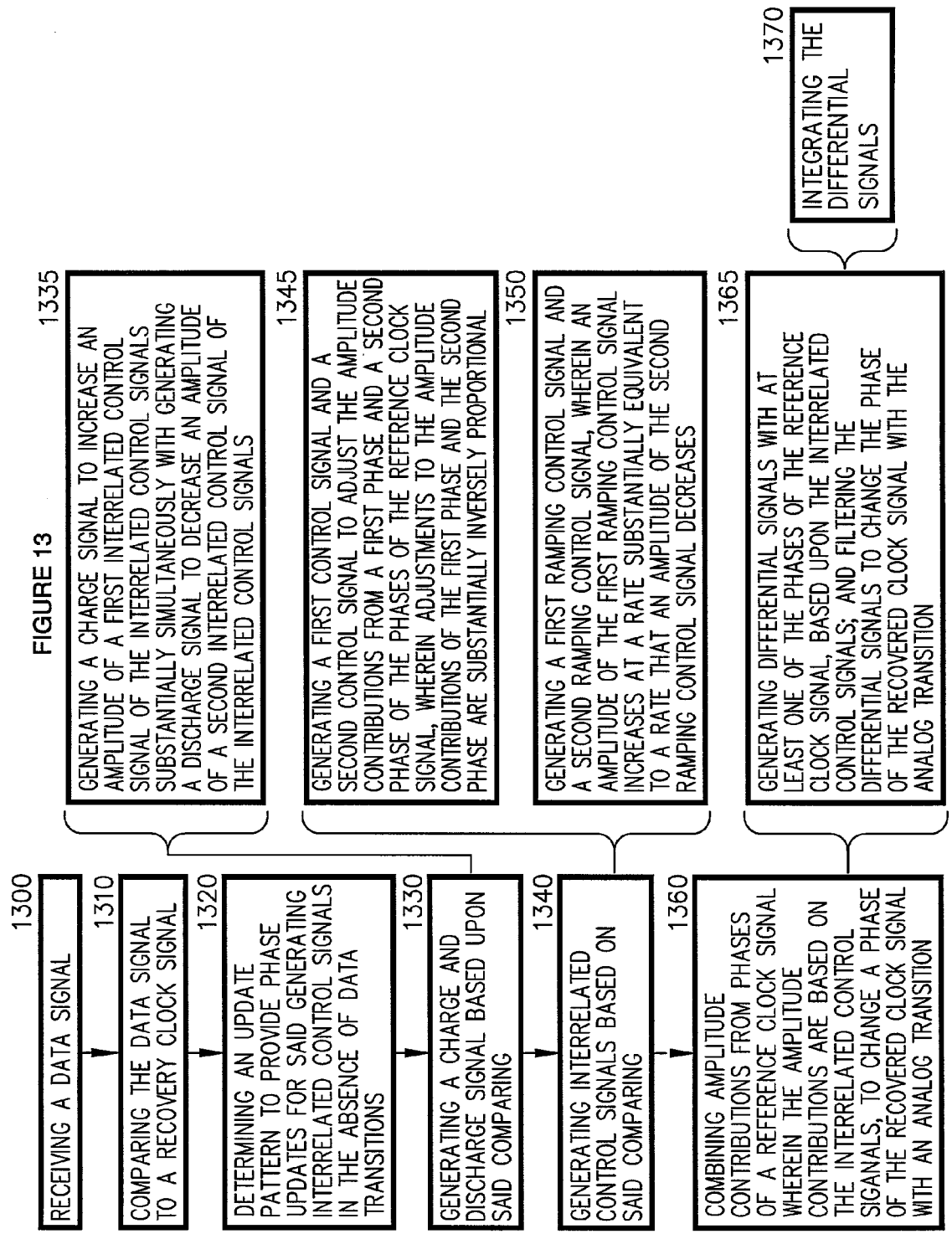
FIG. 13 depicts a flow chart for an embodiment of a phase interpolator based clock recovery system.

Referring now to FIG. 13, there is shown a flow chart for a phase interpolator based clock recovery system. The flow chart comprises receiving a data signal 1300, comparing the data signal to a recovered clock signal 1310, determining an update pattern to provide phase updates for said generating interrelated control signals in the absence of data transitions 1320, generating a charge and discharge signal based upon said comparing 1330, generating interrelated control signals based on said comparing 1340 and combining amplitude contributions from phases of a reference clock signal wherein the amplitude contributions are based on the interrelated control signals, to change a phase of the recovered clock signal with an analog transition 1360. Receiving a data signal 1300 may receive a data signal from a transmission medium such as a fiber optic system via a flow diode and transimpedance amplifier. The data may be clocked data; however, the data signal may be received without the corresponding clock signal. Receiving a data signal 1300 may comprise amplifying the data signal with a low noise amplifier to increase the amplitude of the data signal such that a phase-frequency detector may sample data from the data signal.

Comparing the data signal to a recovered clock signal 1310 may comprise using a recovered clock signal as a sampling clock, determining where a transition in the recovered clock signal occurs with respect to a data bit in the data signal, and outputting a comparison signal to indicate where the transition in the clock signal occurred with respect to the data bit. In some embodiments, comparing the data signal to a recovered clock signal 1310 may comprise comparing the phase of the recovered clock signal to the phase of the data signal. Comparing the data signal to a recovered clock signal 1310 may also comprise comparing a phase shifted recovered clock signal with the data signal.

Comparing a phase shifted recovered clock signal with the data signal may comprise comparing a transition in the phase shifted recovered clock signal with a transition in the data signal to determine whether the transition in the phase shifted recovered clock signal is earlier than, later than, or substantially at the same time as a transition in the data signal. In some embodiments, comparing the data signal to a recovered clock signal 1310 may comprise comparing with a recovered clock signal having a frequency approximately twice the frequency of the data signal, or comparing with a recovered clock signal having a frequency approximately equivalent to the frequency of the data signal.

Determining an update pattern to provide phase updates for said generating interrelated control signals in the absence of data transitions 1320 may comprise tracking noise and adjusting a sampling clock, such as a recovered clock signal, to improve the accuracy of data samples from the data signal. Determining an update pattern to provide phase updates for said generating interrelated control signals in the absence of data transitions 1320 may comprise tracking a frequency of noise that is relatively low compared with the frequency of the clock that transmitted the data signal. Further, tracking a low frequency noise may comprise adjusting the phase of a sampling clock or adjusting sampling times such that a transition in the sampling clock may occur near or at the middle of a data bit of the data signal.

Generating a charge and discharge signal based upon said comparing 1330 may generate control signals to adjust the phase of the recovered clock signal to match the phase of the data signal. Generating a charge and discharge signal based upon said comparing 1330 may comprise generating a charge signal to increase an amplitude of a first interrelated control signal of the interrelated control signals substantially simultaneously with generating a discharge signal to decrease an amplitude of a second interrelated control signal of the interrelated control signals 1335. Generating a charge signal to increase an amplitude of a first interrelated control signal of the interrelated control signals substantially simultaneously with generating a discharge signal to decrease an amplitude of a second interrelated control signal of the interrelated control signals 1335 may generate a charge signal and a discharge signal for the interrelated control signals managing the phase of the recovered clock signal or the interpolated clock signal. In some embodiments, generating a charge signal to increase the amplitude of a first interrelated control signal may comprise transmitting a signal to charge circuitry of a voltage controller to initiate a charging cycle of a charge storage device in the voltage controller and generating a discharge signal may comprise transmitting a signal initiating a discharge cycle for a second charge storage device in the voltage controller. In alternative embodiments, generating a charge signal and generating a discharge signal may comprise transmitting signals to increase the amplitude of a current signal and decrease the amplitude of a second current signal.

Generating interrelated control signals based on said comparing 1340 may generate control signals to modify the amplitude contribution of reference clock signals to an interpolated or recovered clock signal. Generating interrelated control signals based on said comparing 1340 may comprise generating a first control signal and a second control signal to adjust the amplitude contributions from a first phase and a second phase of the phases of the reference clock signal, wherein adjustments to the amplitude contributions of the first phase and the second phase are substantially inversely proportional 1345 and generating a first ramping control signal and a second ramping control signal, wherein an amplitude of the first ramping control signal increases at a rate substantially equivalent to a rate that an amplitude of the second ramping control signal decreases 1350.

Generating a first control signal and a second control signal to adjust the amplitude contributions from a first phase and a second phase of the phases of the reference clock signal, wherein adjustments to the amplitude contributions of the first phase and the second phase are substantially, inversely proportional 1345 may generate a managing control signal. For example, when the result of a phase transition of a recovered clock signal may result in a recovered clock signal having a phase between zero degrees and 90 degrees, the interrelated control signals generated to adjust the amplitude contributions of the zero degree reference clock phase and the 90 degree reference clock phase are the managing interrelated control signal. Managing interrelated control signals, in some embodiments, may comprise the control signal associated with a reference clock phase higher than the intended interpolated clock phase and the control signal associated with the reference clock phase lower than the intended interpolated clock phase. In some embodiments, more than two reference clock phases may manage the phase of the interpolated clock signal so more than two interrelated control signals may be managing interrelated control signals. The resulting interpolated clock signal or recovered clock signal may comprise less DNL, the closer the reference clock phases used to interpolate the recovered clock signal are to one another. For example, when transitioning a recovered clock signal from a 25 degree phase to a 26 phase, interpolating the recovered clock signal between a zero degree reference clock phase and a 45 reference clock phase may transition the recovered clock signal with a higher degree of linearity than interpolating the recovered clock signal between a zero degree reference clock phase and a 90 degree reference clock phase.

Generating a first ramping control signal and a second ramping control signal, wherein an amplitude of the first ramping control signal increases at a rate substantially equivalent to a rate that an amplitude of the second ramping control signal decreases 1350 may generate a first control signal having a slope of alpha and generate a second control signal having a slope of negative alpha. In other embodiments, generating interrelated control signals based on said comparing 1340 may comprise generating sinusoidal control signals phase shifted by approximately 90 degrees such that the rate of increase of one control signal may be increased based on a cosine function and the other decreased based on a sine function, in an analog fashion.

Combining amplitude contributions from phases of a reference clock signal wherein the amplitude contributions are based on the interrelated control signals, to change a phase of the recovered clock signal with an analog transition 1360 may comprise combining more than one reference clock phase having weights based upon the interrelated control signals. In some embodiments, combining amplitude contributions from phases of a reference clock signal wherein the amplitude contributions are based on the interrelated control signals, to change a phase of the recovered clock signal with an analog transition 1360 may comprise receiving more than one reference clock phase, adjusting the contribution of a differential current-steering mechanism associated with each reference clock phase with interrelated control signals and combining the outputs of the differential current-steering mechanisms to interpolate a clock signal. Combining amplitude contributions from phases of a reference clock signal wherein the amplitude contributions are based on the interrelated control signals, to change a phase of the recovered clock signal with an analog transition 1360 may comprise generating differential signals with at least one of the phases of the reference clock signal, based upon the interrelated control signals; and filtering the differential signals to change the phase of the recovered clock signal with the analog transition 1365.

Generating differential signals with at least one of the phases of the reference clock signal, based upon the interrelated control signals; and filtering the differential signals to change the phase of the recovered clock signal with the analog transition 1365 may combine differential currents from the differential current-steering mechanisms through pull-up load circuitry to generate a differential voltage output and may comprise integrating the differential signals 1370. Integrating the differential signals 1370 may comprise considering the combined output of the differential current-steering mechanisms with substantially capacitive and resistive impedances at the outputs. In alternate embodiments, alternative filters may be designed to condition the recovered clock signal for input into a phase-frequency detector.

Figure 14:
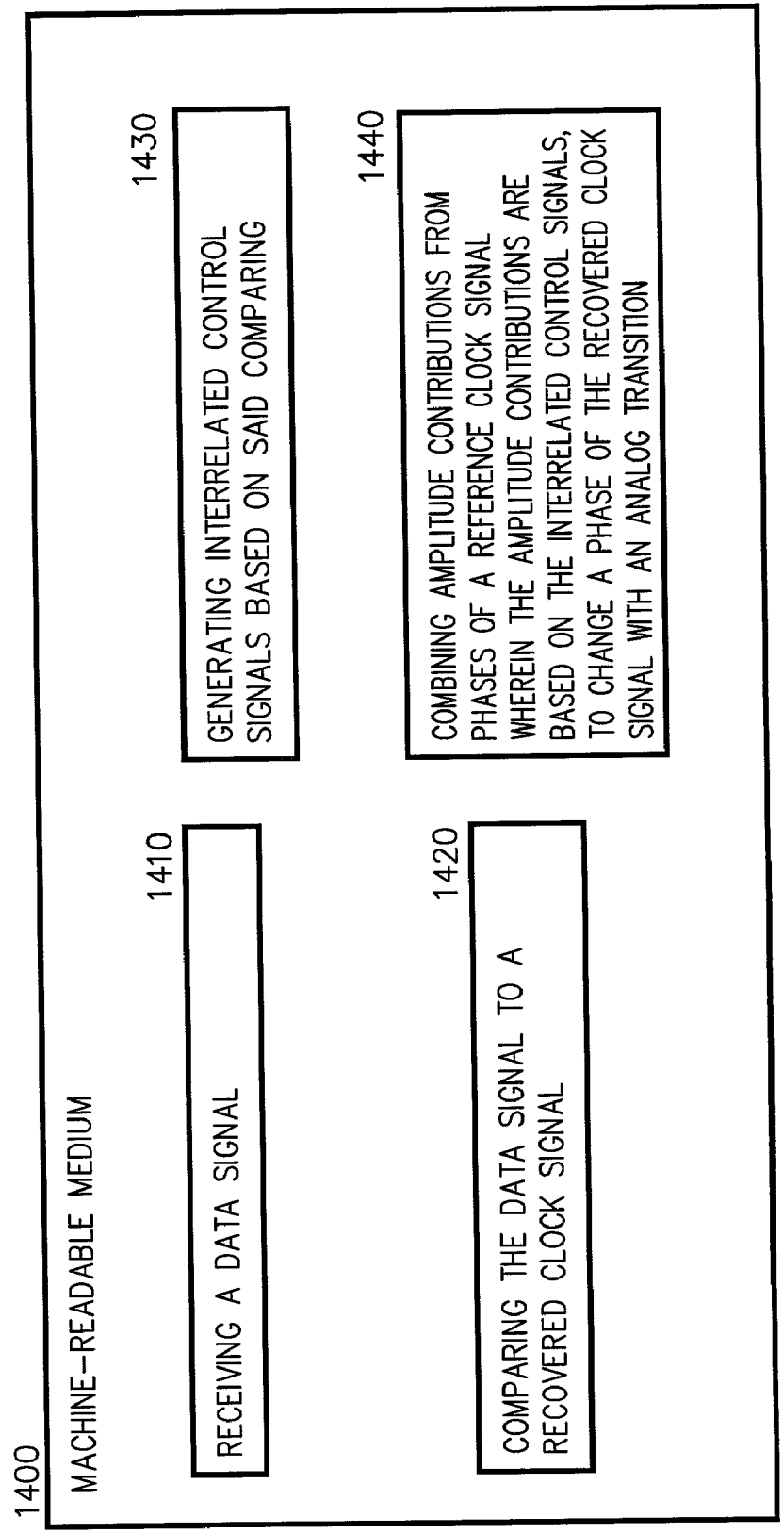
FIG. 14 depicts an embodiment of a machine-readable medium for a phase interpolator based clock recovery system.

Referring now to FIG. 14, a machine-readable medium embodiment of the present invention is shown. A machine-readable medium includes any mechanism that provides (i.e. stores and/or transmits) information in a form readable by a machine (e.g., a computer), that when executed by the machine, may perform the functions described herein. For example, a machine-readable medium may include read only memory (ROM); random access memory (RAM); magnetic disk storage media; optical storage media; flash memory devices; electrical, optical, acoustical or other form of propagated signals (e.g. carrier waves, infrared signals, digital signals, etc.); etc . . . . Several embodiments of the present invention may comprise more than one machine-readable medium depending on the design of the machine.

In particular, machine-readable medium 1400 may comprise instructions for receiving a data signal 1410, comparing the data signal to a recovered clock signal 1420, generating interrelated control signals based on said comparing 1430, and combining amplitude contributions from phases of a reference clock signal wherein the amplitude contributions are based on the interrelated control signals, to change a phase of the recovered clock signal with an analog transition 1440. Receiving a data signal 1410 may comprise instructions to amplify a clocked data signal with a low noise gain to adjust the gain of the data signal to a gain between a low and a high input amplitude range for a phase-frequency detector. In many embodiments, receiving a data signal 1410 comprises receiving a data signal without a corresponding clock signal.

Comparing the data signal to a recovered clock signal 1420 may comprise instructions for comparing the phase of the recovered clock signal to the phase of the data signal and, in some embodiments, may comprise instructions for comparing a 90 degree phase shifted recovered clock signal, or interpolated clock signal, with the phase of the data signal. Comparing the data signal to a recovered clock signal 1420 may determine whether the phase of the recovered clock signal may be increased or decreased with respect to the data signal.

Generating interrelated control signals based on said comparing 1430 may comprise instructions for generating control signals having substantially analog transitions to weight the amplitude contributions of reference clock phases with substantially analog transitions such that a combination of the contributions may be interpolated to transition the recovered clock signal with an analog transition. Analog transitions, or substantially linear transitions, in the phase of an interpolated clock signal may be desirable in many applications over discrete steps in phases of an interpolated clock signal since discrete steps during the phase transition of an interpolated clock signal may introduce a greater degree of non-linearity.

Combining amplitude contributions from phases of a reference clock signal wherein the amplitude contributions are based on the interrelated control signals, to change a phase of the recovered clock signal with an analog transition 1440 may comprise instructions to adjust the amplitude contributions of more than one phase of a reference clock signal in proportion to or substantially in proportion to the amplitudes of the interrelated control signals. Combining amplitude contributions from phases of a reference clock signal wherein the amplitude contributions are based on the interrelated control signals, to change a phase of the recovered clock signal with an analog transition 1440 may further comprise combining reference clock signals with weights based upon the interrelated control signals to output a recovered clock signal transitioning from one phase to another phase with a substantially linear or linear transition.

Figure 15:
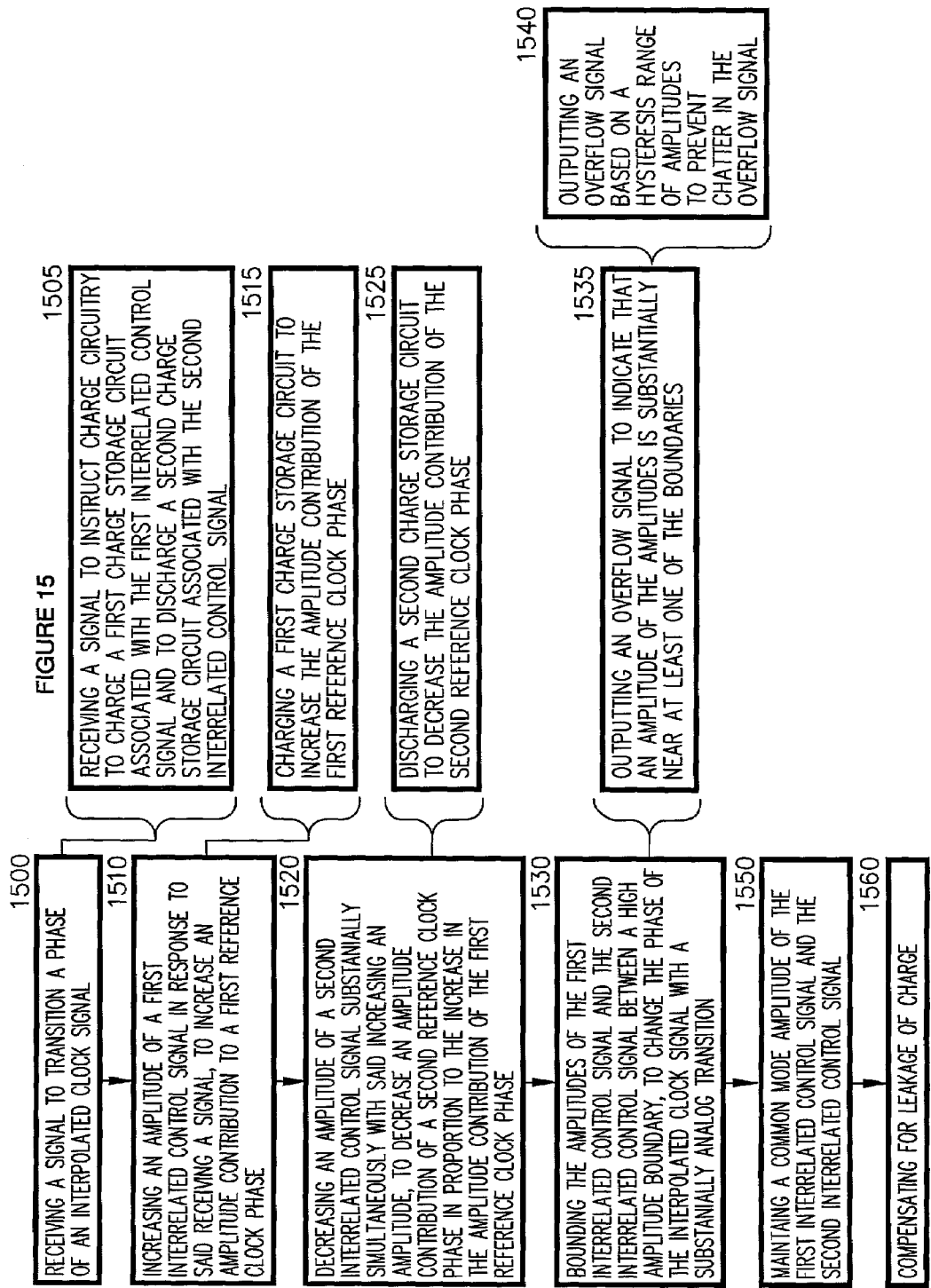
FIG. 15 depicts a flow chart for an embodiment of a phase controller to generate control signals for a highly linear phase interpolator circuit.

Referring now to FIG. 15, there is shown a flow chart for a phase controller to generate control signals for a highly linear phase interpolator circuit. The flow chart may comprise receiving a signal to transition a phase of an interpolated clock signal 1500, increasing an amplitude of a first interrelated control signal in response to said receiving a signal, to increase an amplitude contribution of a first reference clock phase 1510; decreasing an amplitude of a second interrelated control signal substantially simultaneously with said increasing an amplitude, to decrease an amplitude contribution of a second reference clock phase in proportion to the increase in the amplitude contribution of the first reference clock phase 1520; bounding the amplitudes of the first interrelated control signal and the second interrelated control signal between a high amplitude boundary and a low amplitude boundary, to change the phase of the interpolated clock signal with a substantially analog transition 1530; maintaining a common mode amplitude of the first interrelated control signal and the second interrelated control signal 1550; and compensating for leakage of charge 1560. Receiving a signal to transition a phase of an interpolated clock signal 1500 may comprise receiving an indication that more than one interrelated control signal may be modified to adjust contributions of reference clock phases to an interpolated clock signal. Receiving a signal to transition a phase of an interpolated clock signal 1500 may comprise receiving a signal to instruct charge circuitry to charge a first charge storage circuit associated with the first interrelated control signal and to discharge a second charge storage circuit associated with the second interrelated control signal 1505.

Receiving a signal to instruct charge circuitry to charge a first charge storage circuit associated with the first interrelated control signal and to discharge a second charge storage circuit associated with the second interrelated control signal 1505 may comprise receiving a signal to maintain a charge level on a third charge storage, or capacitance circuit. In some embodiments, receiving a signal to transition a phase of an interpolated clock signal 1500 may comprise receiving signals comprising instructions for each charge circuitry and each discharge circuitry, while in other embodiments, a signal may be received by the charge circuitry and discharge circuitry associated with the managing interrelated control signals respectively.

Increasing an amplitude of a first interrelated control signal in response to said receiving a signal, to increase an amplitude contribution of a first reference clock phase 1510 may ramp up the amplitude of the first interrelated control signal in a substantially linear manner and may proportionally or substantially proportionally increase an amplitude contribution of the first reference clock phase. Increasing an amplitude of a first interrelated control signal in response to said receiving a signal, to increase an amplitude contribution of a first reference clock phase 1510 may comprise charging a first charge storage circuit to increase the amplitude contribution of the first reference clock phase 1515. Charging a first charge storage circuit to increase the amplitude contribution of the first reference clock phase 1515 may comprise increasing the charge on a capacitor or a device performing the function of a capacitor to transition the interpolated clock signal toward a reference clock phase associated with that first control signal.

Decreasing an amplitude of a second interrelated control signal substantially simultaneously with said increasing an amplitude, to decrease an amplitude contribution of a second reference clock phase in proportion to the increase in the amplitude contribution of the first reference clock phase 1520 may comprise decreasing the amplitude of the second control signal at a rate substantially equivalent to the rate of increase of the first control signal, to modify the amplitudes of corresponding reference clock phases proportionally. Decreasing an amplitude of a second interrelated control signal substantially simultaneously with said increasing an amplitude, to decrease an amplitude contribution of a second reference clock phase in proportion to the increase in the amplitude contribution of the first reference clock phase 1520 may comprise discharging a second charge storage circuit to decrease the amplitude contribution of the second reference clock phase 1525. Discharging a second charge storage circuit to decrease the amplitude contribution of the second reference clock phase 1525 may remove a finite amount of charge from the second capacitance circuit to decrease the voltage of the second interrelated control signal at a rate substantially equivalent to the rate of increase in the voltage of the first control signal, to transition a phase of the interpolated clock signal away from the reference clock phase associated with the second interrelated control signal.

Bounding the amplitudes of the first interrelated control signal and the second interrelated control signal between a high amplitude boundary and a low amplitude boundary, to change the phase of the interpolated clock signal with a substantially analog transition 1530 may closely bound the amplitudes of the control signals output from the voltage controller to maintain phase control circuitry of a phase interpolator within a small signal region of its transfer function. Bounding the amplitudes of the first interrelated control signal and the second interrelated control signal between a high amplitude boundary and a low amplitude boundary, to change the phase of the interpolated clock signal with a substantially analog transition 1530 may comprise outputting an overflow signal to indicate that an amplitude of the amplitudes is substantially near at least one of the boundaries 1535. Outputting an overflow signal to indicate that an amplitude of the amplitudes is substantially near at least one of the boundaries 1535 may comprise outputting an overflow signal indicating a control signal amplitude reached a high amplitude boundary or outputting an overflow signal indicating a control signal amplitude substantially reached a low amplitude boundary. In some embodiments where the first interrelated control signal comprises a differential control signal, one high amplitude trip may be sufficient to monitor the first interrelated control signal. Similarly, when the second interrelated control signal is a differential control signal, one low amplitude trip may be sufficient to monitor the second interrelated control signal. Outputting an overflow signal to indicate that an amplitude of the amplitudes is substantially near at least one of the boundaries 1535 may comprise outputting an overflow signal based on a hysteresis range of amplitudes to prevent chatter in the overflow signal 1540.

Maintaining a common mode amplitude of the first interrelated control signal and the second interrelated control signal 1550 may comprise comparing the common mode amplitude of the first interrelated control signal and the second interrelated control signal to a common mode amplitude reference and adjusting the amplitudes of the first interrelated control signal and the second interrelated control signal when appropriate. In some embodiments, maintaining a common mode amplitude of the first interrelated control signal and the second interrelated control signal 1550 may comprise maintaining a smaller difference between a high amplitude boundary and the first interrelated control signal than the difference between the low amplitude and the second interrelated control signal.

Compensating for leakage of charge 1560 may comprise compensating for charge leakage through a charging circuit into a charge storage or capacitance circuit, compensating for leakage through the storage capacitance itself, and compensating for charge leakage through a discharging circuit. In some embodiments, compensating for leakage of charge 1560 may comprise providing a conductive path for charge from a capacitance circuit to a voltage near the low amplitude boundary of the associated control signal, to maintain the voltage stored on the capacitance at the low amplitude boundary when enabled.

Figure 16:
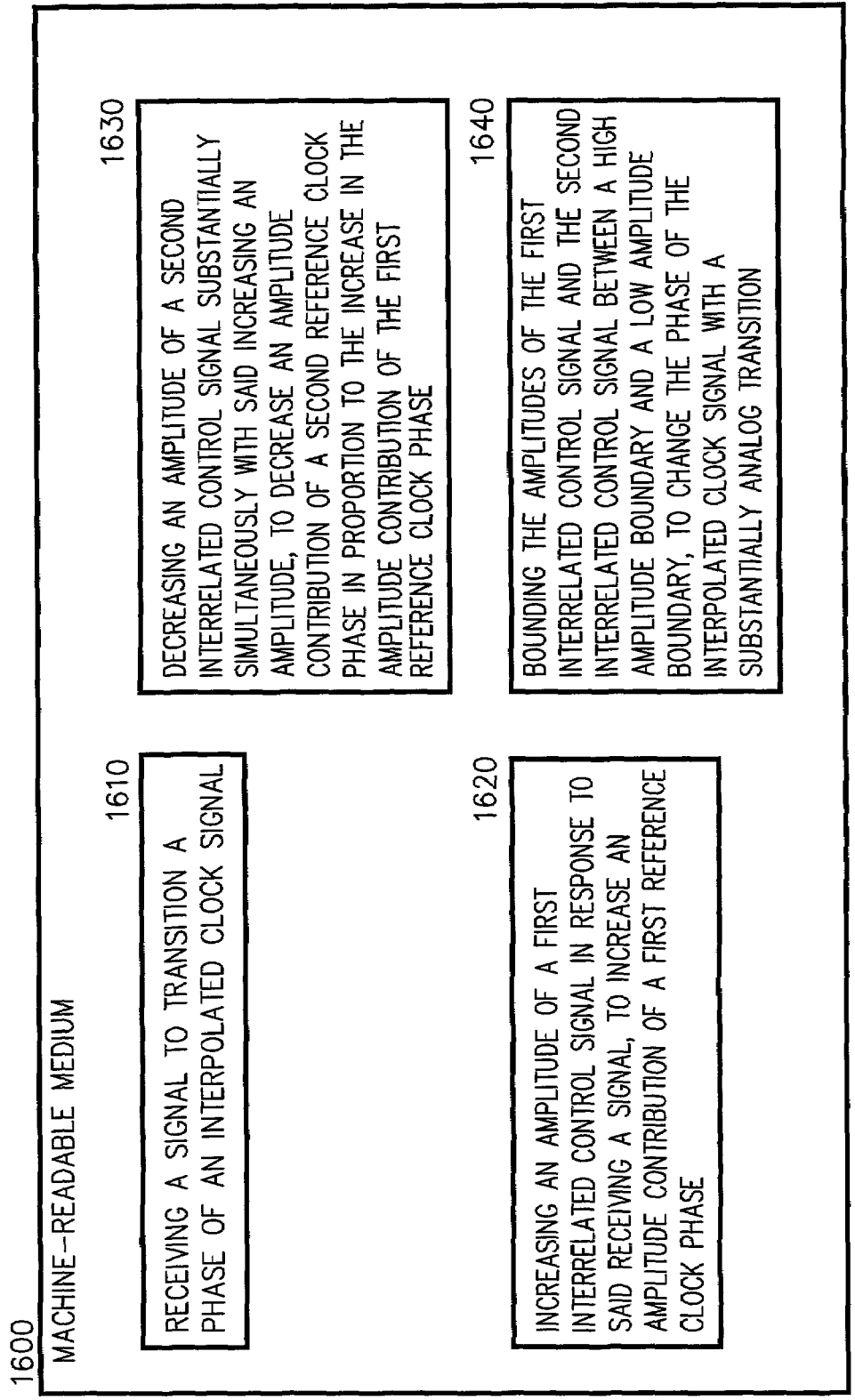
FIG. 16 depicts an embodiment of a machine-readable medium comprising instructions to generate control signals for a highly linear phase interpolator circuit.

Referring now to FIG. 16, there is shown a machine-readable medium 1600 comprising instructions to generate control signals for a highly linear phase interpolator circuit. Machine-readable medium 1600 may comprise instructions for receiving a signal to transition a phase of an interpolated clock signal 1610; increasing an amplitude of a first interrelated control signal in response to said receiving a signal, to increase an amplitude contribution of a first reference clock phase 1620; decreasing an amplitude of a second interrelated control signal substantially simultaneously with said increasing an amplitude, to decrease an amplitude contribution of a second reference clock phase in proportion to the increase in the amplitude contribution of the first reference clock phase 1630; and bounding the amplitudes of the first interrelated control signal and the second interrelated control signal between a high amplitude boundary and a low amplitude boundary, to change the phase of the interpolated clock signal with a substantially analog transition 1640. Receiving a signal to transition a phase of an interpolated clock signal 1610 may comprise instructions to charge and discharge capacitance circuitry to maintain the amplitudes of managing interrelated control signals and to maintain the amplitudes of the remainder of the interrelated control signals at or substantially near the low amplitude boundary.

Increasing an amplitude of a first interrelated control signal in response to said receiving a signal, to increase an amplitude contribution of a first reference clock phase 1620 may comprise instructions to ramp up the voltage of the first control signal substantially linearly. In some embodiments, increasing an amplitude of a first interrelated control signal in response to said receiving a signal, to increase an amplitude contribution of a first reference clock phase 1620 may comprise charging one capacitance of a differential capacitance circuit and discharging the second capacitance to generate a differential interrelated control signal.

Decreasing an amplitude of a second interrelated control signal substantially simultaneously with said increasing an amplitude, to decrease an amplitude contribution of a second reference clock phase in proportion to the increase in the amplitude contribution of the first reference clock phase 1630 may comprise instructions for decreasing the voltage of the second interrelated control signal by discharging capacitance circuitry at a rate substantially equivalent to or slightly less than the rate of increase in voltage of the first interrelated control signal. In some embodiments, when decreasing the amplitude of a second interrelated control signal, the second interrelated control signal may be decreased at a rate proportional to the increase in rate of the first interrelated control signal. In some embodiments, decreasing an amplitude of a second interrelated control signal substantially simultaneously with said increasing an amplitude, to decrease an amplitude contribution of a second reference clock phase in proportion to the increase in the amplitude contribution of the first reference clock phase 1630 may further comprise instructions for decreasing the charge stored in a first capacitance circuit of differential capacitance circuitry and increasing the charge stored on a second capacitance circuit of the differential capacitance circuitry to generate a differential interrelated control signal.

Bounding the amplitudes of the first interrelated control signal and the second interrelated control signal between a high amplitude boundary and a low amplitude boundary, to change the phase of the interpolated clock signal with a substantially analog transition 1640 may comprise instructions for transmitting a signal, such as a pulse, indicating when the first interrelated control signal approaches or reaches a high amplitude boundary and transmitting a signal when the amplitude of the second interrelated control signal approaches or reaches the low amplitude boundary. In other embodiments, bounding the amplitudes of the first interrelated control signal and the second interrelated control signal between a high amplitude boundary and a low amplitude boundary, to change the phase of the interpolated clock signal with a substantially analog transition 1640 may comprise instructions for selecting a new set of interrelated control signals to manage the phase of the interpolated clock signal.

Figure 17:
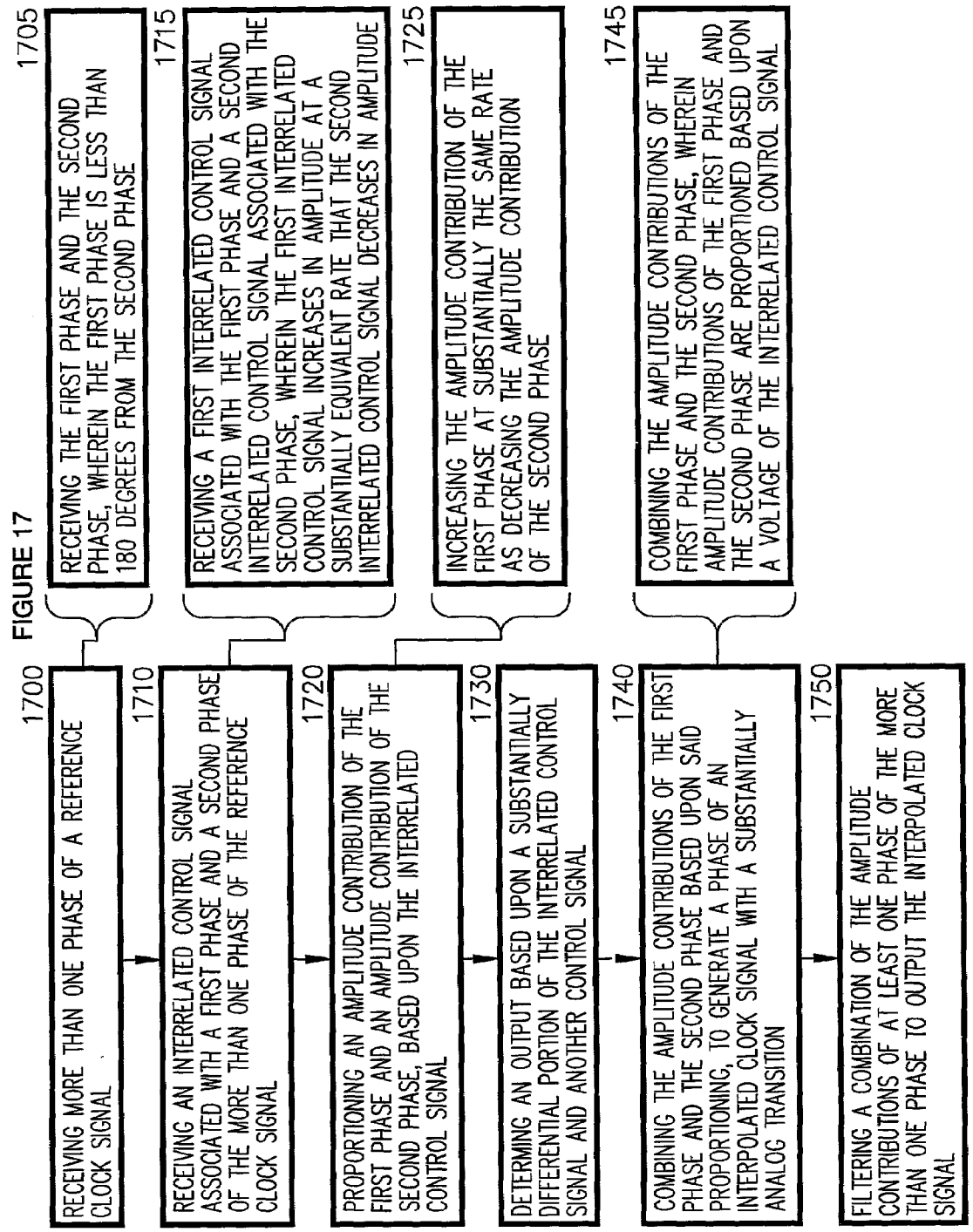
FIG. 17 depicts a flow chart for an embodiment of transitioning the phase of an interpolated clock signal with a substantially analog transition.

Referring now to FIG. 17, there is shown a flow chart for transitioning the phase of an interpolated clock signal with a substantially analog transition. The flow chart may comprise receiving more than one phase of a reference clock signal 1700, receiving an interrelated control signal associated with a first phase and a second phase of the more than one phase of the reference clock signal 1710, proportioning the amplitude contribution of the first phase and the amplitude contribution of the second phase, based upon the interrelated control signal 1720; determining an output based upon a substantially differential portion of the interrelated control signal and another control signal 1730; combining the amplitude contributions of the first phase and the second phase based upon said proportioning, to generate a phase of an interpolated clock signal with a substantially analog transition 1740; and filtering a combination of the amplitude contributions of at least one phase of the more than one phase to output the interpolated clock signal 1750. Receiving more than one phase of a reference clock signal 1700 may comprise receiving the first phase and the second phase, wherein the first phase is less than 180 degrees away from the second phase 1705. For example, a phase lock loop may output a reference clock signal at a zero degree phase, a 90-degree phase, 180-degree phase, and a 270-degree phase. The reference clock phases may be differential and have substantially stable phases for a constant input impedance, such as capacitance of a differential current-steering mechanism.

Receiving an interrelated control signal associated with a first phase and a second phase of the more than one phase of the reference clock signal 1710 may comprise receiving a first interrelated control signal associated with the first phase and a second interrelated control signal associated with the second phase, wherein the first interrelated control signal increases in amplitude at a substantially equivalent rate that the second interrelated control signal decreases in amplitude 1715. Receiving a first interrelated control signal associated with the first phase and a second interrelated control signal associated with the second phase, wherein the first interrelated control signal increases in amplitude at a substantially equivalent rate that the second interrelated control signal decreases in amplitude 1715 may comprise receiving a control signal having a linearly increasing voltage and a control signal having a linearly decreasing voltage. In some embodiments, the control signal having a linearly increasing voltage may slightly dominate the control signal having the linearly decreasing voltage.

Proportioning an amplitude contribution of the first phase and an amplitude contribution of the second phase, based upon the interrelated control signal 1720 may comprise adjusting or setting the bias current through a differential current-steering mechanism associated with the first phase of the reference clock signal in proportion to the amplitude of the first managing interrelated control signal and adjusting or setting the bias current through a second differential current-steering mechanism in proportion to an amplitude of a second managing interrelated control signal. Proportioning an amplitude contribution of the first phase and an amplitude contribution of the second phase, based upon the interrelated control signal 1720 may comprise increasing the amplitude contribution of the first phase at substantially the same rate as decreasing the amplitude contribution of the second phase 1725. Increasing the amplitude contribution of the first phase at substantially the same rate as decreasing the amplitude contribution of the second phase 1725 may comprise applying the first managing interrelated control signal to the gate of a field effect transistor coupled with a differential current-steering mechanism, wherein the differential current-steering mechanism may be associated with the first phase of the reference clock signal. And applying the second managing interrelated control signal to the gate of a second field effect transistor coupled with a second differential current-steering mechanism, wherein the second differential current-steering mechanism may be associated with the second phase of the reference clock signal. An interrelated control signal may or may not be differential and may be coupled with a degenerative mesh or not. In some embodiments, wherein an interrelated control signal comprises a differential control signal, phase control circuitry may comprise a differential current steering mechanism or differential amplifier to adjust the amplitude contribution of the first phase and/or second phase.

Determining an output based upon a substantially differential portion of the interrelated control signal and another control signal 1730 may comprise apportioning current between differential current-steering mechanisms for reference clock phases based upon degenerative impedances of each differential current-steering mechanism associated with the reference clock phases. For example, although a current mirror attempts to draw 5 milli-amps of current through a differential current-steering mechanism associated with a reference clock phase of zero degrees, the control circuitry associated with the interrelated control signal for the zero degree reference clock phase may restrict the bias current for that differential current-steering mechanism to 3 milli-amps. Thus, the current mirror for the zero degree reference clock phase may attempt to pull up to 2 milli-amps through a degenerative mesh interconnecting the current mirror with differential current-steering mechanisms associated with other phases of the reference clock signal.

Combining the amplitude contributions of the first phase and the second phase based upon said proportioning, to generate a phase of an interpolated clock signal with a substantially analog transition 1740 may comprise combining the amplitude contributions of the first phase and the second phase, wherein amplitude contributions of the first phase and the second phase are proportioned based upon a voltage of the interrelated control signal 1745. Combining the amplitude contributions of the first phase and the second phase, wherein amplitude contributions of the first phase and the second phase are proportioned based upon a voltage of the interrelated control signal 1745 may comprise combining the drain or collector currents of at least two differential current-steering mechanisms in pull-up load circuitry to generate a common differential voltage output for the differential current-steering mechanisms.

Filtering a combination of the amplitude contributions of at least one phase of the more than one phase to output the interpolated clock signal 1750 may comprise filtering the combined output of the differential current-steering mechanisms with an integrating filter. In other embodiments, a multi-state filter to remove a tone of a sinusoidal wave may be incorporated. In still other embodiments, a substantially resistive load may filter the combined outputs of the differential current-steering mechanisms.

Figure 18:
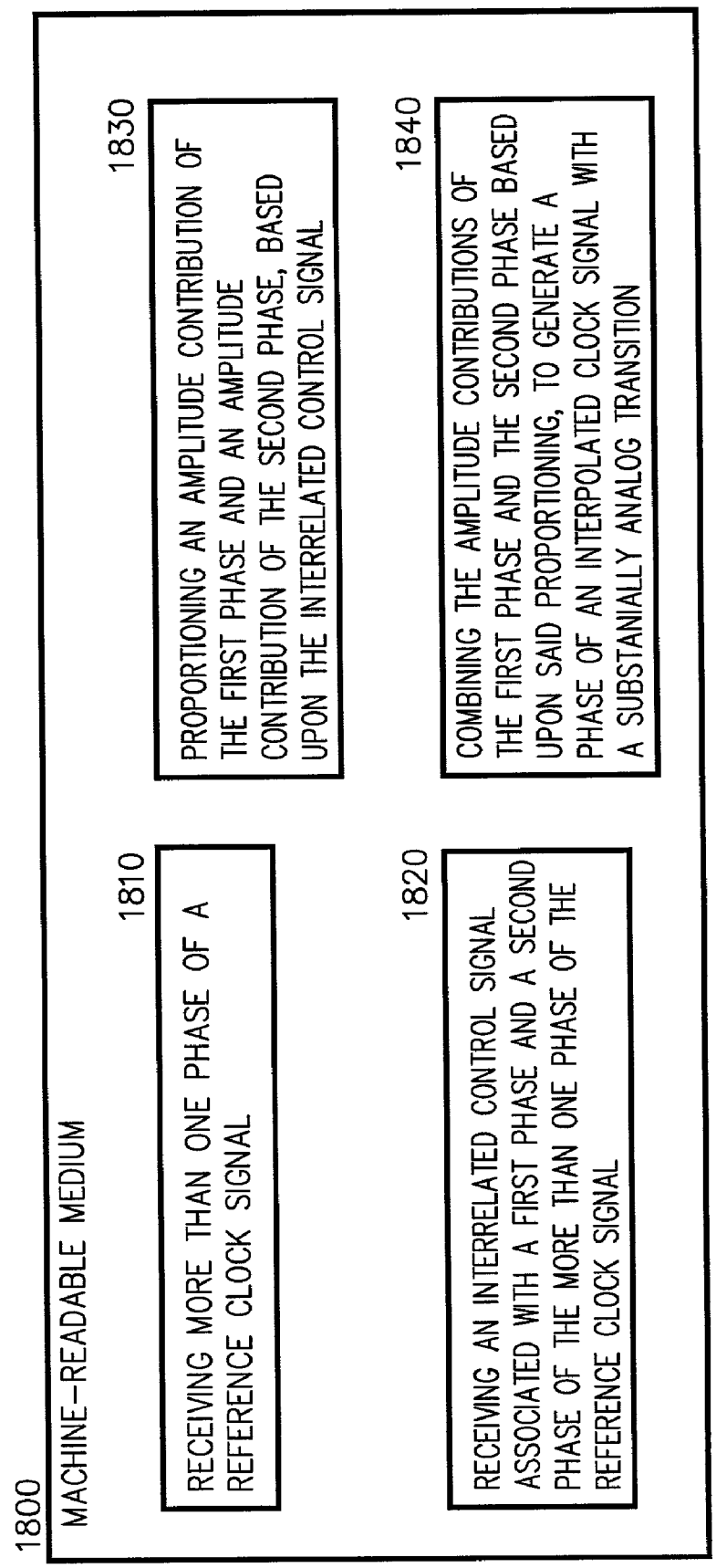
FIG. 18 depicts an embodiment of a machine-readable medium comprising instructions to transition the phase of an interpolated clock signal with a substantially analog transition.

Referring now to FIG. 18, there is shown a machine-readable medium 1800 comprising instructions to transition the phase of an interpolated clock signal with a substantially analog transition. Machine-readable medium 1800 may comprise instructions for receiving more than one phase of a reference clock signal 1810, receiving an interrelated control signal associated with a first phase and a second phase of the more than one phase of the reference clock signal 1820; proportioning an amplitude contribution of the first phase and an amplitude contribution of the second phase, based upon the interrelated control signal 1830; and combining the amplitude contributions of the first phase and the second phase based upon said proportioning, to generate a phase of an interpolated clock signal with a substantially analog transition 1840. Receiving more than one phase of a reference clock signal 1810 may comprise instructions for applying more than one phase of reference clock signal to inputs of more than one differential current-steering mechanism. In many embodiments, receiving more than one phase of a reference clock signal 1810 may comprise instructions for receiving differential signals or pseudo-differential signals for each phase of the reference clock signal.

Receiving an interrelated control signal associated with a first phase and a second phase of the more than one phase of the reference clock signal 1820 may comprise instructions for applying the control signal to phase control circuitry associated with the phase of the reference clock signal. In some embodiments, receiving an interrelated control signal associated with a first phase and a second phase of the more than one phase of the reference clock signal 1820 may comprise instructions for receiving a differential control signal associated with a phase of the reference clock signal and applying the differential signal to a differential current-steering mechanism of phase control circuitry associated with the phase of the reference clock signal.

Proportioning the amplitude contribution of the first phase and the amplitude contribution of the second phase, based upon the interrelated control signal 1830 may comprise instructions for adjusting the bias current of a differential current-steering mechanism between a current substantially near a keep alive current to a current that may cause the output of the corresponding differential current-steering mechanism to enter a triode region of operation or approach the triode region. In some embodiments, proportioning an amplitude contribution of the first phase and an amplitude contribution of the second phase, based upon the interrelated control signal 1830 may comprise instructions for adjusting the gain of a differential current-steering mechanism for the phase of the reference clock signal based upon an interrelated control signal, wherein the interrelated control signal may comprise a ramping voltage.

Combining the amplitude contributions of the first phase and the second phase based upon said proportioning, to generate a phase of an interpolated clock signal with a substantially analog transition 1840 may comprise instructions for summing the output currents of differential current-steering mechanisms associated with the more than one phase of the reference clock signal. In some embodiments, combining the amplitude contributions of the first phase and the second phase based upon said proportioning, to generate a phase of an interpolated clock signal with a substantially analog transition 1840 may also comprise filtering the outputs of the differential current-steering mechanisms to condition the interpolated clock signal such that the interpolated clock signal is suitable for input into other circuitry.

What is claimed is:

1. An apparatus, comprising:
   interpolator circuitry to proportion amplitude contributions of reference clock phases;
   phase control circuitry coupled with said interpolator circuitry to adjust the proportion of the amplitude contributions based upon an interrelated control signal, the phase control circuitry to provide the interpolation circuitry with a bias current that varies according to the interrelated control signal;
   degenerative mesh circuitry coupled with said phase control circuitry to control the variation of the bias current based upon a substantially differential portion of the interrelated control signal and another control signal; and
   output circuitry coupled with said interpolator circuitry to generate a phase of an interpolated clock signal based upon a combination of the amplitude contributions.

2. The apparatus of claim 1, wherein the degenerative mesh circuitry comprises substantially equivalent impedances coupled between more than two circuits of said phase control circuitry.

3. The apparatus of claim 1, wherein said interpolator circuitry comprises a current-steering mechanism to generate a current from a particular one of the reference clock phases with the bias current.

4. The apparatus of claim 3, wherein said phase control circuitry comprises a conductive path coupled between a current source and the current-steering mechanism to adjust the bias current in substantially linear proportion to a change in the interrelated control signal.

5. The apparatus of claim 1, wherein said interpolator circuitry comprises a differential current-steering mechanism to steer the bias current between two conductive paths based upon a substantially differential signal of the reference clock phases.

6. The apparatus of claim 1, wherein said interpolator circuitry comprises a differential current-steering mechanism to determine an amplitude contribution of a particular one of the reference clock phases based upon an amplitude of the bias current pulled through the differential current-steering mechanism.

7. The apparatus of claim 1, wherein said phase control circuitry comprises circuitry coupled with said interpolator circuitry to adjust an amplitude of the bias current based upon the interrelated control signal.

8. The apparatus of claim 1, wherein said phase control circuitry comprises a differential amplifier having an output for the bias current coupled to said interpolator circuitry.

9. The apparatus of claim 1, wherein said output circuitry comprises circuitry to combine amplitude contributions of a first phase and a second phase of the reference clock phases.

10. The apparatus of claim 1, wherein said output circuitry comprises filtering circuitry to filter the amplitude contributions of the reference clock phases.

11. The apparatus of claim 10, wherein the filtering circuitry comprises circuitry to integrate the amplitude contributions of the reference clock phases.

12. The apparatus of claim 10, wherein the filtering circuitry comprises circuitry to differentiate the amplitude contributions of the reference clock phases.

13. A method, comprising:
    receiving more than one phase of a reference clock signal;
    receiving an interrelated ramping control voltage signal associated with a first phase and a second phase of the more than one phase of the reference clock signal;
    proportioning an amplitude contribution of the first phase and an amplitude contribution of the second phase, based upon the interrelated control signal; and
    combining the amplitude contributions of the first phase and the second phase based upon said proportioning, to generate a phase of an interpolated clock signal with a substantially analog transition.

14. The method of claim 13, further comprising filtering a combination of the amplitude contributions of at least one phase of the more than one phase to output the interpolated clock signal.

15. The method of claim 13, further comprising determining an output based upon a substantially differential portion of the interrelated control signal and another control signal.

16. The method of claim 13, wherein said receiving more than one phase of a reference clock signal comprises receiving the first phase and the second phase, wherein the first phase is less than 180 degrees from the second phase.

17. The method of claim 16, wherein said receiving an interrelated control signal comprises receiving a first interrelated control signal associated with the first phase and a second interrelated control signal associated with the second phase, wherein the first interrelated control signal increases in amplitude at a substantially equivalent rate that the second interrelated control signal decreases in amplitude.

18. The method of claim 13, wherein said proportioning comprises increasing the amplitude contribution of the first phase at substantially the same rate as decreasing the amplitude contribution of the second phase.

19. The method of claim 13, wherein said combining comprises combining the amplitude contributions of the first phase and the second phase, wherein amplitude contributions of the first phase and the second phase are proportioned based upon a voltage of the interrelated control signal.

20. A system, comprising:
    a phase controller to provide N interrelated control signals, N being three or more;
    clock circuitry to provide reference clock phases; and
    a phase interpolator coupled to said clock circuitry, comprising
    interpolator circuitry to proportion amplitude contributions of the reference clock phases as a function of the N current signals;
    phase control circuitry coupled with the interpolator circuitry to adjust the proportion of amplitude contributions based upon the N interrelated control signals, the phase control circuitry having N amplifier circuits that adjust the N current signals in accordance with the N interrelated control signals;

mesh circuitry coupled between the N amplifier circuits to degenerate the N amplifier circuits; and output circuitry coupled with the interpolator circuitry to generate a phase of an interpolated clock signal based upon a combination of the amplitude contributions.

21. The system of claim 20, wherein said interpolator circuitry comprises a differential current-steering mechanism to determine an amplitude contribution of a particular reference clock phase of the reference clock phases based upon an amplitude of a bias current pulled through the differential current-steering mechanism.

22. The system of claim 21, wherein said phase control circuitry comprises a conductive path coupled between a current source and the current-steering mechanism to adjust the bias current in substantially linear proportion to a change in a particular one of the N interrelated control signals.

23. An apparatus, comprising:

interpolator circuitry to proportion amplitude contributions of reference clock phases;

phase control circuitry coupled with said interpolator circuitry to adjust the proportion of the amplitude contributions based upon an interrelated control signal;

current circuitry coupled with said phase control circuitry to provide a static bias current;

degenerative mesh circuitry coupled with said phase control circuitry to apportion the static bias current based upon the interrelated control signal; and output circuitry coupled with said interpolator circuitry to generate a phase of an interpolated clock signal based upon a combination of the amplitude contributions.

24. The apparatus of claim 23, wherein said interpolator circuitry comprises a current-steering mechanism to generate a current from a particular one of the reference clock phases with a bias current.

25. The apparatus of claim 23, wherein said interpolator circuitry comprises a differential current-steering mechanism to steer a bias current between two conductive paths based upon a substantially differential signal of the reference clock phases.

26. The apparatus of claim 23, wherein said interpolator circuitry comprises a differential current-steering mechanism to determine an amplitude contribution of a particular one of the reference clock phases based upon an amplitude of a bias current pulled through the differential current-steering mechanism.

27. The apparatus of claim 26, wherein said phase control circuitry comprises a conductive path coupled between a current source and the current-steering mechanism to adjust the bias current in substantially linear proportion to a change in the interrelated control signal.

28. The apparatus of claim 23, wherein said phase control circuitry comprises a conductive path coupled between a current source and a current-steering mechanism to adjust a bias current in substantially linear proportion to a change in the interrelated control signal.

29. The apparatus of claim 23, wherein said output circuitry comprises circuitry to combine amplitude contributions of a first phase and a second phase of the reference clock phases.

* * * * *